(12) United States Patent
Yan et al.

(10) Patent No.: US 12,249,383 B2
(45) Date of Patent: Mar. 11, 2025

(54) SHIFT REGISTER AND DRIVING METHOD THEREFOR, GATE DRIVING CIRCUIT, AND DISPLAY DEVICE

(71) Applicant: BOE Technology Group Co., Ltd., Beijing (CN)

(72) Inventors: Wei Yan, Beijing (CN); Zhen Wang, Beijing (CN); Wenwen Qin, Beijing (CN); Han Zhang, Beijing (CN); Deshuai Wang, Beijing (CN); Jian Zhang, Beijing (CN); Yue Shan, Beijing (CN); Xiaoyan Yang, Beijing (CN); Yadong Zhang, Beijing (CN); Jian Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/794,991

(22) PCT Filed: Sep. 28, 2021

(86) PCT No.: PCT/CN2021/121419
§ 371 (c)(1),
(2) Date: Jul. 25, 2022

(87) PCT Pub. No.: WO2023/050086
PCT Pub. Date: Apr. 6, 2023

(65) Prior Publication Data
US 2024/0212772 A1 Jun. 27, 2024

(51) Int. Cl.
*G11C 19/28* (2006.01)
*G09G 3/20* (2006.01)

(52) U.S. Cl.
CPC .............. *G11C 19/28* (2013.01); *G09G 3/20* (2013.01); *G09G 2310/0286* (2013.01)

(58) Field of Classification Search
CPC ... G09G 2310/0286; G09G 2310/0289; G09G 3/20; G11C 19/28
See application file for complete search history.

(56) References Cited

U.S. PATENT DOCUMENTS

2016/0365034 A1 12/2016 Chan
2017/0221441 A1 8/2017 Gu et al.
(Continued)

FOREIGN PATENT DOCUMENTS

CN 102376275 A 3/2012
CN 105047168 A 11/2015
(Continued)

*Primary Examiner* — Robin J Mishler
(74) *Attorney, Agent, or Firm* — Ling Wu; Stephen Yang; Ling and Yang Intellectual Property

(57) ABSTRACT

A shift register and a driving method therefor, a gate driving circuit and a display device are provided, wherein the shift register includes a pull-up control sub-circuit configured to provide a signal of a first signal terminal or a second signal terminal to a pull-up control node under control of a first input terminal and a second output terminal; the pull-down control sub-circuit is configured to provide a signal of a first power supply terminal or a second power supply terminal to a pull-down node under control of the pull-up control node, the first signal terminal, the second signal terminal, a first clock signal terminal and a second clock signal terminal; the output sub-circuit is configured to supply a signal of a third clock signal terminal to a first output terminal and a signal of a fourth clock signal terminal to the second output terminal.

17 Claims, 9 Drawing Sheets

(56) References Cited

U.S. PATENT DOCUMENTS

| | | |
|---|---|---|
| 2018/0157366 A1 | 6/2018 | Du |
| 2019/0006018 A1 | 1/2019 | Fang et al. |
| 2019/0073939 A1 | 3/2019 | Hu et al. |
| 2019/0080780 A1 | 3/2019 | Wang et al. |
| 2020/0051655 A1* | 2/2020 | Dong .................. G09G 3/3677 |
| 2021/0118347 A1 | 4/2021 | Wang et al. |
| 2021/0343210 A1 | 11/2021 | Fu et al. |
| 2021/0358362 A1* | 11/2021 | Zhang ................. G11C 19/287 |

FOREIGN PATENT DOCUMENTS

| | | |
|---|---|---|
| CN | 105335003 A | 2/2016 |
| CN | 105761758 A | 7/2016 |
| CN | 106297624 A | 1/2017 |
| CN | 104732950 B | 3/2017 |
| CN | 106601175 A | 4/2017 |
| CN | 106652964 A | 5/2017 |
| CN | 108231122 A | 6/2018 |
| CN | 105096865 B | 9/2018 |
| CN | 106128403 B | 10/2018 |
| CN | 106683634 B | 1/2019 |
| CN | 109473069 A | 3/2019 |
| CN | 107068088 B | 4/2019 |
| CN | 110379352 A | 10/2019 |
| CN | 110689858 A | 1/2020 |

\* cited by examiner

SHIFT REGISTER AND DRIVING METHOD THEREFOR, GATE DRIVING CIRCUIT, AND DISPLAY DEVICE

CROSS-REFERENCE TO RELATED APPLICATION

The present application is a U.S. National Phase Entry of International Application PCT/CN2021/121419 having an international filing date of Sep. 28, 2021 and entitled "Shift Register and Driving Method Therefor, Gate Driving Circuit, and Display Device", and the contents disclosed in the above-mentioned application are hereby incorporated as a part of this application.

TECHNICAL FIELD

The present disclosure relates, but is not limited, to the field of display technology, and in particular to a shift register, a method for driving the shift register, a gate driving circuit, and a display device.

BACKGROUND

In recent years, flat panel displays, such as Thin Film Transistor-Liquid Crystal Displays (TFT-LCDs) and Active Matrix Organic Light Emitting Diodes (AMOLEDs), have been widely used in TV, mobile phone, and other electronic products because of their light weight, small thickness, and low power consumption.

With the development of science and technology, display panels with high resolution and narrow bezels have become a development trend. Therefore, Gate Driver on Array (GOA) technology has emerged. The GOA technology refers to a technology that GOA circuits used for driving gate lines are arranged on both sides of an effective display region of an array substrate in the display panel.

SUMMARY

The following is a summary of subject matter described herein in detail. The summary is not intended to limit a protection scope of claims.

In a first aspect, the present disclosure provides a shift register, including a pull-up control sub-circuit, a pull-down control sub-circuit, an output sub-circuit and a noise reduction sub-circuit;

the pull-up control sub-circuit is electrically connected with a first input terminal, a second output terminal, a first signal terminal, a second signal terminal and a pull-up control node, respectively, and is configured to provide a signal of the first signal terminal or the second signal terminal to the pull-up control node under control of the first input terminal and the second output terminal;

the pull-down control sub-circuit is electrically connected with a first clock signal terminal, a second clock signal terminal, the first signal terminal, the second signal terminal, the pull-up control node, a pull-down node, a first power supply terminal and a second power supply terminal, respectively, and is configured to provide a signal of the first power supply terminal or the second power supply terminal to the pull-down node under control of the pull-up control node, the first signal terminal, the second signal terminal, the first clock signal terminal and the second clock signal terminal;

the output sub-circuit is electrically connected with the pull-up control node, the first power supply terminal, a third clock signal terminal, a first output terminal, a fourth clock signal terminal and the second output terminal, respectively, and is configured to provide a signal of the third clock signal terminal to the first output terminal and provide a signal of the fourth clock signal terminal to the second output terminal under control of the pull-up control node and the first power supply terminal; and the noise reduction sub-circuit is electrically connected with the pull-up control node, the first output terminal, the second output terminal, the pull-down node and the second power supply terminal, respectively, and is configured to provide a signal of the second power supply terminal to the pull-up control node, the first output terminal and the second output terminal under control of the pull-down node.

In some possible implementations, the output sub-circuit includes a first output sub-circuit and a second output sub-circuit;

the first output sub-circuit is electrically connected with the pull-up control node, the first power supply terminal, the third clock signal terminal and the first output terminal, respectively, and is configured to provide a signal of the third clock signal terminal to the first output terminal under control of the first power supply terminal and the pull-up control node; and the second output sub-circuit is electrically connected with the pull-up control node, the first power supply terminal, the fourth clock signal terminal and the second output terminal, respectively, and is configured to provide a signal of the fourth clock signal terminal to the second output terminal under control of the first power supply terminal and the pull-up control node.

In some possible implementations, the shift register further includes a reset sub-circuit;

the reset sub-circuit is electrically connected with a reset signal terminal, the pull-up control node and the second power supply terminal, respectively, and is configured to provide a signal of the second power supply terminal to the pull-up control node under control of the reset signal terminal.

In some possible implementations, the pull-up control sub-circuit includes a first transistor and a second transistor;

a control electrode of the first transistor is electrically connected with the first input terminal, a first electrode of the first transistor is electrically connected with the first signal terminal, and a second electrode of the first transistor is electrically connected with the pull-up control node; and a control electrode of the second transistor is electrically connected with the second input terminal, a first electrode of the second transistor is electrically connected with the second signal terminal, and a second electrode of the second transistor is electrically connected with the pull-up control node.

In some possible implementations, the pull-down control sub-circuit includes a third transistor, a fourth transistor, a fifth transistor, a sixth transistor and a first capacitor;

a control electrode of the third transistor is electrically connected with the first signal terminal, a first electrode of the third transistor is electrically connected with the first clock signal terminal, and a second electrode of the third transistor is electrically connected with the pull-down control node;

a control electrode of the fourth transistor is electrically connected with the second signal terminal, a first electrode of the fourth transistor is electrically connected with the second clock signal terminal, and a second electrode of the fourth transistor is electrically connected with the pull-down control node;

a control electrode of the fifth transistor is electrically connected with the pull-down control node, a first electrode of the fifth transistor is electrically connected with the first power supply terminal, and a second electrode of the fifth transistor is electrically connected with the pull-down node;

a control electrode of the sixth transistor is electrically connected with the pull-up control node, a first electrode of the sixth transistor is electrically connected with the pull-down node, and a second electrode of the sixth transistor is electrically connected with the second power supply terminal; and a first electrode of the first capacitor is electrically connected with the pull-down node, and a second electrode of the first capacitor is electrically connected with the second power supply terminal.

In some possible implementations, the first output sub-circuit includes a seventh transistor, an eighth transistor and a second capacitor;

a control electrode of the seventh transistor is electrically connected with the first power supply terminal, a first electrode of the seventh transistor is electrically connected with the pull-up control node, and a second electrode of the seventh transistor is electrically connected with a first pull-up node;

a control electrode of the eighth transistor is electrically connected with the first pull-up node, a first electrode of the eighth transistor is electrically connected with the third clock signal terminal, and a second electrode of the eighth transistor is electrically connected with the first output terminal; and a first electrode of the second capacitor is electrically connected with the first pull-up node, and a second electrode of the second capacitor is electrically connected with the first output terminal.

In some possible implementations, the second output sub-circuit includes a ninth transistor, a tenth transistor and a third capacitor;

a control electrode of the ninth transistor is electrically connected with the first power supply terminal, a first electrode of the ninth transistor is electrically connected with the pull-up control node, and a second electrode of the ninth transistor is electrically connected with a second pull-up node;

a control electrode of the tenth transistor is electrically connected with the second pull-up node, a first electrode of the tenth transistor is electrically connected with the fourth clock signal terminal, and a second electrode of the tenth transistor is electrically connected with the second output terminal; and a first electrode of the third capacitor is electrically connected with the second pull-up node, and a second electrode of the third capacitor is electrically connected with the second output terminal.

In some possible implementations, the noise reduction sub-circuit includes an eleventh transistor, a twelfth transistor and a thirteenth transistor;

a control electrode of the eleventh transistor is electrically connected with the pull-down node, a first electrode of the eleventh transistor is electrically connected with the pull-up control node, and a second electrode of the eleventh transistor is electrically connected with the second power supply terminal;

a control electrode of the twelfth transistor is electrically connected with the pull-down node, a first electrode of the twelfth transistor is electrically connected with the first output terminal, and a second electrode of the twelfth transistor is electrically connected with the second power supply terminal; and a control electrode of the thirteenth transistor is electrically connected with the pull-down node, a first electrode of the thirteenth transistor is electrically connected with the second output terminal, and a second electrode of the thirteenth transistor is electrically connected with the second power supply terminal.

In some possible implementations, the reset sub-circuit includes a fourteenth transistor;

a control electrode of the fourteenth transistor is electrically connected with the reset signal terminal, a first electrode of the fourteenth transistor is electrically connected with the pull-up control node, and a second electrode of the fourteenth transistor is electrically connected with the second power supply terminal.

In some possible implementations, the shift register further includes a reset sub-circuit; the pull-up control sub-circuit includes a first transistor and a second transistor; the pull-down control sub-circuit includes a third transistor, a fourth transistor, a fifth transistor, a sixth transistor and a first capacitor; the output sub-circuit includes a seventh transistor, an eighth transistor, a second capacitor, a ninth transistor, a tenth transistor and a third capacitor; the noise reduction sub-circuit includes an eleventh transistor, a twelfth transistor and a thirteenth transistor; and the reset sub-circuit includes a fourteenth transistor;

a control electrode of the first transistor is electrically connected with the first input terminal, a first electrode of the first transistor is electrically connected with the first signal terminal, and a second electrode of the first transistor is electrically connected with the pull-up control node;

a control electrode of the second transistor is electrically connected with the second input terminal, a first electrode of the second transistor is electrically connected with the second signal terminal, and a second electrode of the second transistor is electrically connected with the pull-up control node;

a control electrode of the third transistor is electrically connected with the first signal terminal, a first electrode of the third transistor is electrically connected with the first clock signal terminal, and a second electrode of the third transistor is electrically connected with the pull-down control node;

a control electrode of the fourth transistor is electrically connected with the second signal terminal, a first electrode of the fourth transistor is electrically connected with the second clock signal terminal, and a second electrode of the fourth transistor is electrically connected with the pull-down control node;

a control electrode of the fifth transistor is electrically connected with the pull-down control node, a first electrode of the fifth transistor is electrically connected with the first power supply terminal, and a second electrode of the fifth transistor is electrically connected with the pull-down node;

a control electrode of the sixth transistor is electrically connected with the pull-up control node, a first electrode of the sixth transistor is electrically connected with the pull-down node, and a second electrode of the sixth transistor is electrically connected with the second power supply terminal;

a first electrode of the first capacitor is electrically connected with the pull-down node, and a second electrode of the first capacitor is electrically connected with the second power supply terminal;

a control electrode of the seventh transistor is electrically connected with the first power supply terminal, a first electrode of the seventh transistor is electrically connected with the pull-up control node, and a second electrode of the seventh transistor is electrically connected with a first pull-up node;

a control electrode of the eighth transistor is electrically connected with the first pull-up node, a first electrode of the eighth transistor is electrically connected with the third clock signal terminal, and a second electrode of the eighth transistor is electrically connected with the first output terminal;

a first electrode of the second capacitor is electrically connected with the first pull-up node, and a second electrode of the second capacitor is electrically connected with the first output terminal;

a control electrode of the ninth transistor is electrically connected with the first power supply terminal, a first electrode of the ninth transistor is electrically connected with the pull-up control node, and a second electrode of the ninth transistor is electrically connected with a second pull-up node;

a control electrode of the tenth transistor is electrically connected with the second pull-up node, a first electrode of the tenth transistor is electrically connected with the fourth clock signal terminal, and a second electrode of the tenth transistor is electrically connected with the second output terminal;

a first electrode of the third capacitor is electrically connected with the second pull-up node, and a second electrode of the third capacitor is electrically connected with the second output terminal;

a control electrode of the eleventh transistor is electrically connected with the pull-down node, a first electrode of the eleventh transistor is electrically connected with the pull-up control node, and a second electrode of the eleventh transistor is electrically connected with the second power supply terminal;

a control electrode of the twelfth transistor is electrically connected with the pull-down node, a first electrode of the twelfth transistor is electrically connected with the first output terminal, and a second electrode of the twelfth transistor is electrically connected with the second power supply terminal;

a control electrode of the thirteenth transistor is electrically connected with the pull-down node, a first electrode of the thirteenth transistor is electrically connected with the second output terminal, and a second electrode of the thirteenth transistor is electrically connected with the second power supply terminal; and a control electrode of the fourteenth transistor is electrically connected with the reset signal terminal, a first electrode of the fourteenth transistor is electrically connected with the pull-up control node, and a second electrode of the fourteenth transistor is electrically connected with the second power supply terminal.

In a second aspect, the present disclosure further provides a gate driving circuit, including multiple cascaded shift registers described above.

A first input terminal of an i+1 stage shift register is electrically connected with a first output terminal of an i stage shift register, and a second input terminal of the i+1 stage shift register is electrically connected with a second output terminal of an i+2 stage shift register.

In some possible implementations, the gate driving circuit further includes an initial signal line, a first clock line, a second clock line, a third clock line, a fourth clock line, a fifth clock line, a sixth clock line, a reset signal line, a first power supply line, a second power supply line, a first signal line and a second signal line;

reset signal terminals of all shift registers are connected with the reset signal line, first power supply terminals of all the shift registers are connected with the first power supply line, second power supply terminals of all the shift registers are connected with the second power supply line, first signal terminals of all the shift registers are connected with the first signal line, and second signal terminals of all the shift registers are connected with the second signal line; and a first input terminal of a first stage shift register is connected with the initial signal line, a first clock signal terminal of a 3i-2 stage shift register is connected with the sixth clock line, a second clock signal terminal of the 3i-2 stage shift register is connected with the first clock line, a third clock signal terminal of the 3i-2 stage shift register is connected with the third clock line, a fourth clock signal terminal of the 3i-2 stage shift register is connected with the fourth clock line, a first clock signal terminal of a 3i-1 stage shift register is connected with the second clock line, a second clock signal terminal of the 3i-1 stage shift register is connected with the third clock line, a third clock signal terminal of the 3i-1 stage shift register is connected with the fifth clock line, a fourth clock signal terminal of the 3i-1 stage shift register is connected with the sixth clock line, a first clock signal terminal of a 3i stage shift register is connected with the fourth clock line, a second clock signal terminal of the 3i stage shift register is connected with the fifth clock line, a third clock signal terminal of the 3i stage shift register is connected with the first clock line, and a fourth clock signal terminal of the 3i stage shift register is connected with the second clock line.

In a third aspect, the present disclosure further provides a display device, including the gate driving circuit described above and multiple scan signal lines; the scan signal lines extend in a first direction, and the plurality of scan signal lines are arranged in a second direction, wherein the first direction and the second direction intersect; and the j stage shift register in the gate driving circuit is connected with the (2j-1)-th scan signal line and the 2j-th scan signal line, $1 \leq j \leq N$, N is the number of shift registers included in the gate driving circuit.

In some possible implementations, a length of the gate driving circuit in the first direction is about 0.35 mm to 0.37 mm.

In the fourth aspect, the present disclosure further provides a method for driving a shift register. The method is configured to drive the shift register described above. The method includes the following operations:

a pull-up control sub-circuit provides a signal of a first signal terminal or a second signal terminal to a pull-up control sub-circuit under control of a first input terminal and a second output terminal;

a pull-down control sub-circuit provides a signal of a first power supply terminal or a second power supply terminal to a pull-down node under control of a pull-up control node, the first signal terminal, the second signal terminal, a first clock signal terminal and a second clock signal terminal;

an output sub-circuit provides a signal of a third clock signal terminal to a first output terminal and provides a signal of a fourth clock signal terminal to a second output terminal under control of the pull-up control node and the first power supply terminal; and a noise reduction sub-circuit provides a signal of the second power supply terminal to the pull-up control node, the first output terminal and the second output terminal.

In some possible implementations, the method further includes the following operation: a reset sub-circuit provides a signal of the second power supply terminal to the pull-up control node under control of a reset signal terminal.

Other aspects will become apparent upon reading and understanding of the drawings and detailed description.

BRIEF DESCRIPTION OF DRAWINGS

Accompany drawings are used to provide understanding for technical solutions of the present disclosure, and form a part of the description. They are used to explain the technical solutions of the present disclosure together with embodiments of the present disclosure, and do not form a limitation on the technical solutions of the present disclosure.

DETAILED DESCRIPTION

Figure 1:
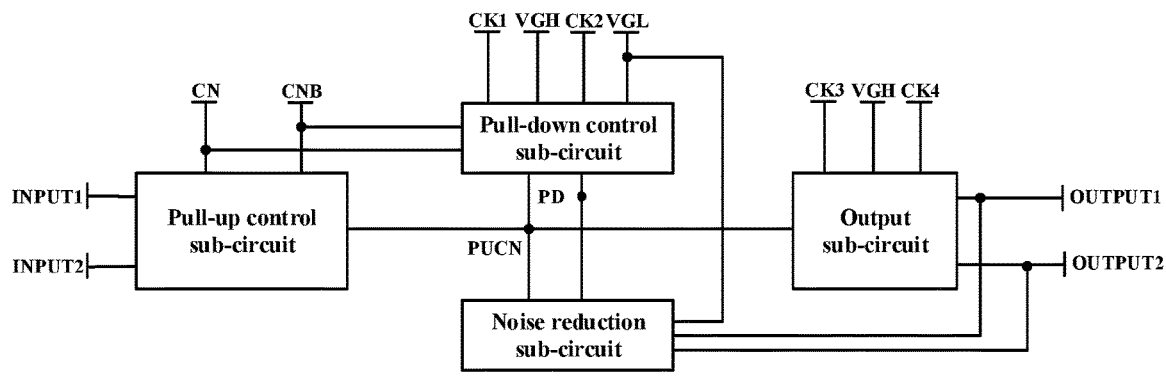
FIG. 1 is a schematic structural diagram of a shift register according to an embodiment of the present disclosure.

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art can easily understand such a fact that implementations and contents may be transformed into various forms without departing from the purpose and scope of the present disclosure. Therefore, the present disclosure should not be interpreted as being limited to the contents recorded in the following implementations only. The embodiments in the present disclosure and features in the embodiments may be randomly combined with each other if there is no conflict. In order to keep the following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to conventional designs.

Sometimes for clarity, a size of each constituent element, a thickness of a layer, or a region in the drawings may be exaggerated. Therefore, one mode of the present disclosure is not necessarily limited to the size, and shapes and sizes of various components in the drawings do not reflect actual scales. In addition, the accompanying drawings schematically show ideal examples, and an implementation of the present disclosure is not limited to a shape, a numerical value, or the like shown in the accompanying drawings.

Ordinal numerals such as "first", "second", and "third" in the specification are set to avoid confusion between constituent elements, but are not intended to limit in terms of quantity.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The position relationships between the constituent elements change appropriately according to the direction in which the various constituent elements are described. Therefore, description is not limited to the wordings used in the specification, and appropriate substitutions may be made according to situations.

In the specification, unless otherwise specified and defined explicitly, terms "mount", "mutually connect", and "connect" should be understood in a broad sense. For example, the connection may be a fixed connection, a detachable connection or an integrated connection, or may be a mechanical connection or an electrical connection, or may be a direct connection, an indirect connection through intermediate components, or internal communication between two components. Those of ordinary skills in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current can flow through the drain electrode, the channel region and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In the case that transistors with opposite polarities are used or that a current direction is changed during circuit operation, functions of "the source electrode" and "the drain electrode" may sometimes be exchanged. Therefore, the "source electrode" and the "drain electrode" may be exchanged in the specification.

In the specification, "electrical connection" includes a case that constituent elements are connected together through an element with a certain electrical effect. The "element with a certain electric action" is not particularly limited as long as it allows sending and receiving of electric signals between the connected constituent elements. Examples of the "element with a certain electric action" include not only electrodes and wirings, but also switching elements such as transistors, resistors, inductors, capacitors, other elements with various functions, etc.

In the present disclosure, "about" refers to that a boundary is defined not so strictly and numerical values within process and measurement error ranges are allowed.

A GOA circuit in a display device includes multiple shift registers. Since the GOA circuit includes many devices and occupies a large area, the display device is unable to realize narrow bezel and has high power consumption.

FIG. 1 is a schematic structural diagram of a shift register according to an embodiment of the present disclosure. As shown in FIG. 1, the shift register according to the embodiment of the present disclosure may include a pull-up control sub-circuit, a pull-down control sub-circuit, an output sub-circuit and a noise reduction sub-circuit. The pull-up control sub-circuit is electrically connected with a first input terminal INPUT1, a second output terminal OUTPUT2, a first signal terminal CN, a second signal terminal CNB and a pull-up control node PUCN, respectively, and is configured to provide a signal of the first signal terminal CN or the second signal terminal CNB to the pull-up control node PUCN under control of the first input terminal INPUT1 and the second output terminal OUTPUT2. The pull-down control sub-circuit is electrically connected with a first clock signal terminal CK1, a second clock signal terminal CK2, the first signal terminal CN, the second signal terminal CNB, the pull-up control node PUCN, a pull-down node PD, a first power supply terminal VGH and a second power supply terminal VGL, respectively, and is configured to provide a signal of the first power supply terminal VGH or the second power supply terminal VGL to the pull-down node PD under control of the pull-up control node PUCN, the first signal terminal CN, the second signal terminal CNB, the first clock signal terminal CK1 and the second clock signal terminal CK2. The output sub-circuit is electrically connected with the pull-up control node PUCN, the first power supply terminal VGH, a third clock signal terminal CK3, a first output terminal OUTPUT1, a fourth clock signal terminal CK4 and the second output terminal OUTPUT2, respectively, and is configured to provide a signal of the third clock signal terminal CK3 to the first output terminal OUTPUT1 and a signal of the fourth clock signal terminal CK4 to the second output terminal OUTPUT2 under control of the pull-up control node PUCN and the first power supply terminal VGH. The noise reduction sub-circuit is electrically connected with the pull-up control node PUCN, the first output terminal OUTPUT1, the second output terminal OUTPUT2, the pull-down node PD and the second power supply terminal VGL, respectively, and is configured to provide a signal of the second power supply terminal VGL to the pull-up control node PUCN, the first output terminal OUTPUT1 and the second output terminal OUTPUT2 under control of the pull-down node PD.

In an exemplary embodiment, the first output terminal OUTPUT1 and the second output terminal OUTPUT2 of the shift register respectively output two different driving signals. The time when the first output terminal OUTPUT1 outputs an effective level signal does not coincide with the time when the second output terminal OUTPUT2 outputs an effective level signal. The effective level signal refers to the signal that is able to turn on a transistor.

In an exemplary embodiment, an input signal of the first input terminal INPUT1 is a pulse signal, an input signal of the second input terminal INPUT2 is a pulse signal, and an input signal of the reset signal terminal RESET is a pulse signal.

In an exemplary embodiment, the first power supply terminal VGH continuously provides a high level signal, and the second power supply terminal VGL continuously provides a low level signal.

Input signals of the first clock signal terminal CK1, the second clock signal terminal CK2, the third clock signal terminal CK3 and the fourth clock signal terminal CK4 are clock signals. The time when the input signal of the third clock signal terminal CK3 is an effective level signal does not coincide with the time when the input signal of the fourth clock signal terminal CK4 is an effective level signal.

In an exemplary embodiment, modes of the gate driving circuit where the shift register is located may include a forward scan mode and a reverse scan mode. When the gate driving circuit is in the forward scan mode, the output of the shift register of the current stage occurs after output of a shift register of the previous stage, and when the gate driving circuit is in the reverse scan mode, the output of the shift register of the current stage occurs after output of a shift register of the next stage. When the gate driving circuit is in the forward scan mode, the time when the input signal of the first signal terminal CN of the shift register of the current stage is an effective level signal coincides with the time when the input signal of the first clock signal terminal CK1 is an effective level signal, and the time when the input signal of the second signal terminal CNB of the shift register of the current stage is an effective level signal does not coincide with the time when the input signal of the second clock signal terminal CK2 is an effective level signal. When the gate driving circuit is in the reverse scan mode, the time when the input signal of the first signal terminal CN of the shift register of the current stage is an effective level signal does not coincide with the time when the input signal of the first clock signal terminal CK1 is an effective level signal, and the time when the input signal of the second signal terminal CNB of the shift register of the current stage is an effective level signal coincides with the time when the input signal of the second clock signal terminal CK2 is an effective level signal. The invalid level signal refers to a signal that is able to turn off a transistor.

The noise reduction sub-circuit in the present disclosure may reduce noise in the shift register and improve working stability, use reliability and display effect of the display device.

A shift register according to an embodiment of the present disclosure includes a pull-up control sub-circuit, a pull-down control sub-circuit, an output sub-circuit and a noise reduction sub-circuit. The pull-up control sub-circuit is electrically connected with a first input terminal, a second output terminal, a first signal terminal, a second signal terminal and a pull-up control node, respectively, and is configured to provide a signal of the first signal terminal or the second signal terminal to the pull-up control node under control of the first input terminal and the second output terminal. The pull-down control sub-circuit is electrically connected with a first clock signal terminal, a second clock signal terminal, the first signal terminal, the second signal terminal, the pull-up control node, a pull-down node, a first power supply terminal and a second power supply terminal, respectively, and is configured to provide a signal of the first power supply terminal or the second power supply terminal to the pull-down node under control of the pull-up control node, the first signal terminal, the second signal terminal, the first clock signal terminal and the second clock signal terminal. The output sub-circuit is electrically connected with the pull-up control node, the first power supply terminal, a third clock signal terminal, a first output terminal, a fourth clock signal terminal and the second output terminal, respectively, and is configured to provide a signal of the third clock signal terminal to the first output terminal and provide a signal of the fourth clock signal terminal to the second output terminal under control of the pull-up control node and the first power supply terminal. The noise reduction sub-circuit is electrically connected with the pull-up control node, the first output terminal, the second output terminal, the pull-down node and the second power supply terminal, respectively, and is configured to provide a signal of the second power supply terminal to the pull-up control node, the first output terminal and the second output terminal under control of the pull-down node. By outputting two driving signals through one shift register, a narrow bezel of a display device may be achieved and power consumption may be reduced in the present disclosure.

In an exemplary embodiment, the output sub-circuit may include a first output sub-circuit and a second output sub-circuit. The first output sub-circuit is electrically connected with the pull-up control node PUCN, the first power supply terminal VGH, the third clock signal terminal CK3 and the first output terminal OUTPUT1, respectively, and is configured to supply a signal of the third clock signal terminal CK3 to the first output terminal OUTPUT1 under control of the first power supply terminal VGH and the pull-up control node PUCN. The second output sub-circuit is electrically connected with the pull-up control node PUCN, the first power supply terminal VGH, the fourth clock signal terminal CK4 and the second output terminal OUTPUT2, respectively, and is configured to supply a signal of the fourth clock signal terminal CK4 to the second output terminal OUTPUT2 under control of the first power supply terminal VGH and the pull-up control node PUCN.

Figure 2:
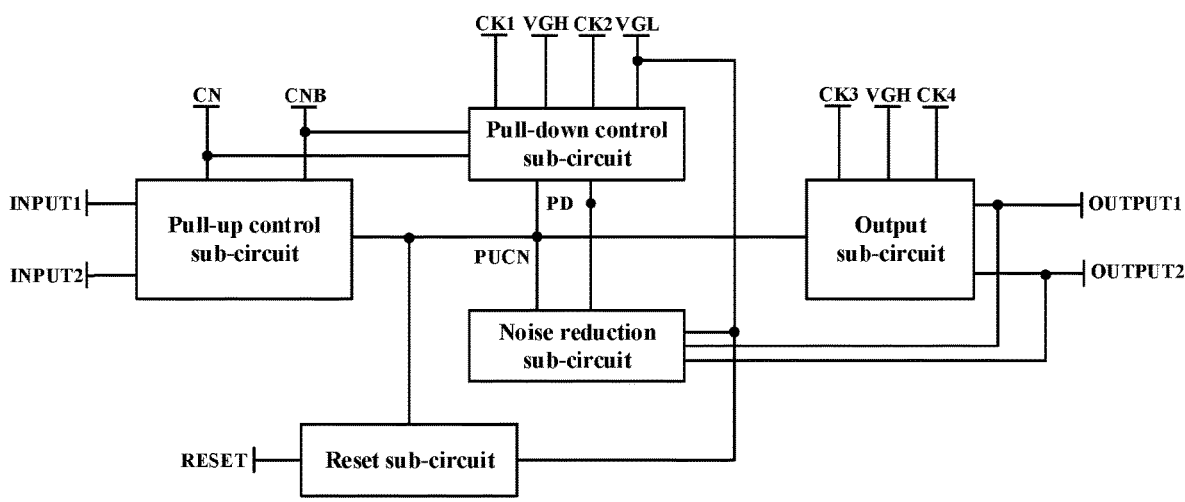
FIG. 2 is a schematic structural diagram of a shift register according to an exemplary embodiment.

FIG. 2 is a schematic structural diagram of a shift register according to an exemplary embodiment. As shown in FIG. 2, the shift register according to the exemplary embodiment may further include a reset sub-circuit. The reset sub-circuit is electrically connected with a reset terminal RESET, the pull-up control node PUCN and the second power supply terminal VGL, respectively, and is configured to provide a signal of the second power supply terminal VGL to the pull-up control node PUCN under control of the reset terminal RESET.

The reset sub-circuit in the present disclosure may reset the shift register, reduce the noise in the shift register, and improve the working stability, the use reliability and the display effect of the display device.

Figure 3:
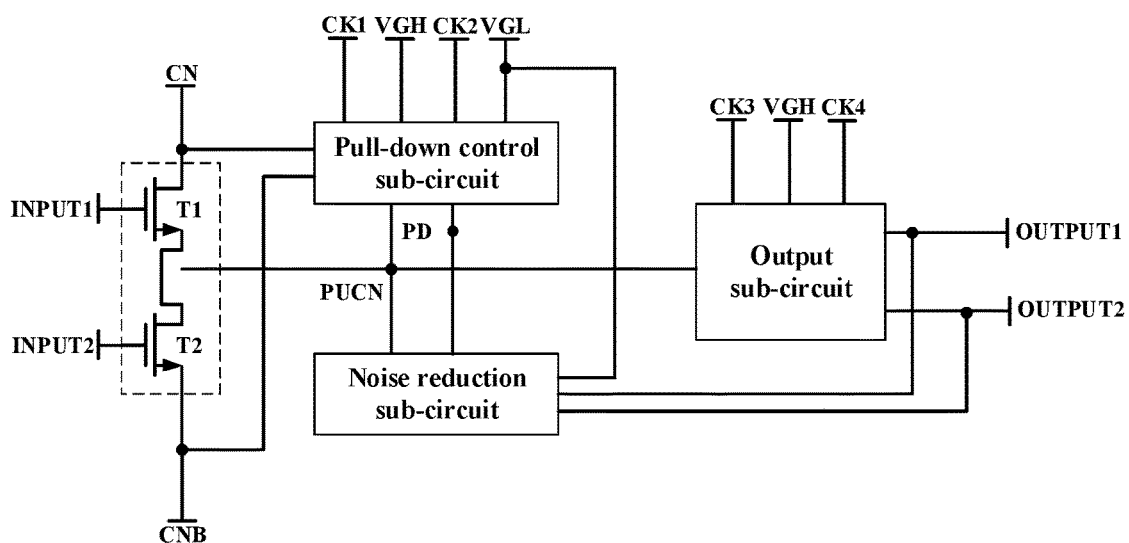
FIG. 3 is a diagram of an equivalent circuit of a pull-up control sub-circuit according to an exemplary embodiment.

FIG. 3 is a diagram of an equivalent circuit of a pull-up control sub-circuit according to an exemplary embodiment. As shown in FIG. 3, the pull-up control sub-circuit according to the exemplary embodiment includes a first transistor T1 and a second transistor T2.

In an exemplary embodiment, a control electrode of the first transistor T1 is electrically connected with the first input terminal INPUT1, a first electrode of the first transistor T1 is electrically connected with the first signal terminal CN, and a second electrode of the first transistor T1 is electrically connected with the pull-up control node PUCN. A control electrode of the second transistor T2 is electrically connected with the second input terminal INPUT2, a first electrode of the second transistor T2 is electrically connected with the second signal terminal CNB, and a second electrode of the second transistor T2 is electrically connected with the pull-up control node PUCN.

In this embodiment, FIG. 3 shows an exemplary structure of a pull-up control sub-circuit, and the present disclosure is not limited thereto.

Figure 4:
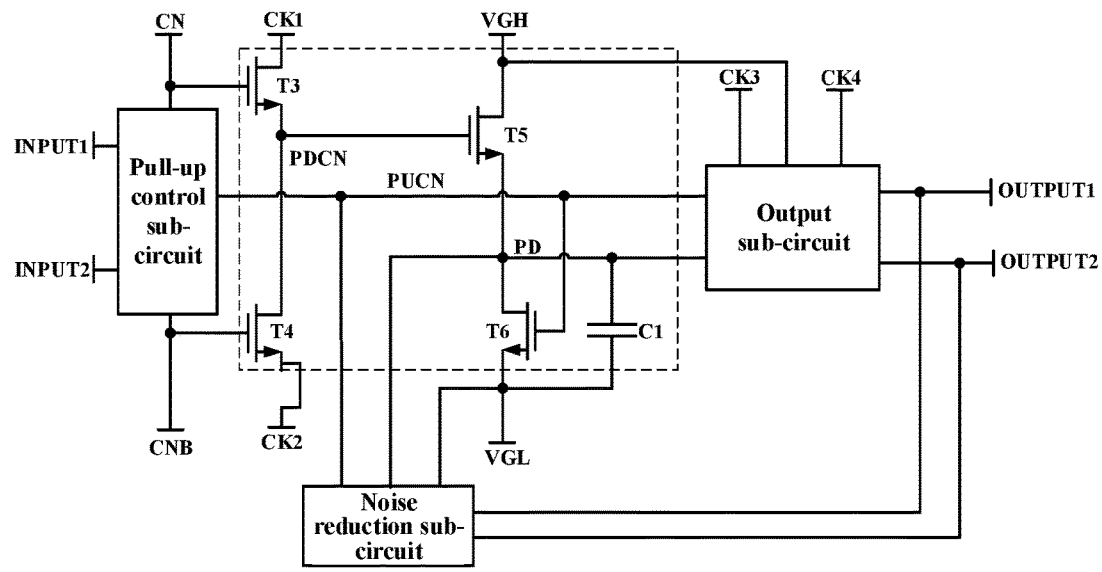
FIG. 4 is a diagram of an equivalent circuit of a pull-down control sub-circuit according to an exemplary embodiment.

FIG. 4 is a diagram of an equivalent circuit of a pull-down control sub-circuit according to an exemplary embodiment. As shown in FIG. 4, the pull-down control sub-circuit according to the exemplary embodiment may include a third transistor T3, a fourth transistor T4, a fifth transistor T5, a sixth transistor T6 and a first capacitor C1.

In an exemplary embodiment, a control electrode of the third transistor T3 is electrically connected with the first signal terminal CN, a first electrode of the third transistor T3 is electrically connected with the first clock signal terminal CK1, and a second electrode of the third transistor T3 is electrically connected with the pull-down control node PDCN. A control electrode of the fourth transistor T4 is electrically connected with the second signal terminal CNB, a first electrode of the fourth transistor T4 is electrically connected with the second clock signal terminal CK2, and a second electrode of the fourth transistor T4 is electrically connected with the pull-down control node PDCN. A control electrode of the fifth transistor T5 is electrically connected with the pull-down control node PDCN, a first electrode of the fifth transistor T5 is electrically connected with the first power supply terminal VGH, and a second electrode of the fifth transistor T5 is electrically connected with the pull-down node PD. A control electrode of the sixth transistor T6 is electrically connected with the pull-up control node PUCN, a first electrode of the sixth transistor T6 is electrically connected with the pull-down node PD, and a second electrode of the sixth transistor T6 is electrically connected with the second power supply terminal VGL. A first electrode of the first capacitor C1 is electrically connected with the pull-down node PD, and a second electrode of the first capacitor C1 is electrically connected with the second power supply terminal VGL.

The sixth transistor T6 in the present disclosure is controlled by the pull-up control node PUCN. When the signal of the pull-up control node PUCN is an effective level signal, the sixth transistor T6 is turned on, and a signal of the pull-down node PD is pulled low by the low level signal of the second power supply terminal VGL, thereby avoiding formation of a current path in the shift register and reducing the power consumption of the display device.

In this embodiment, FIG. 4 shows an exemplary structure of a pull-up control sub-circuit, and the present disclosure is not limited thereto.

Figure 5:
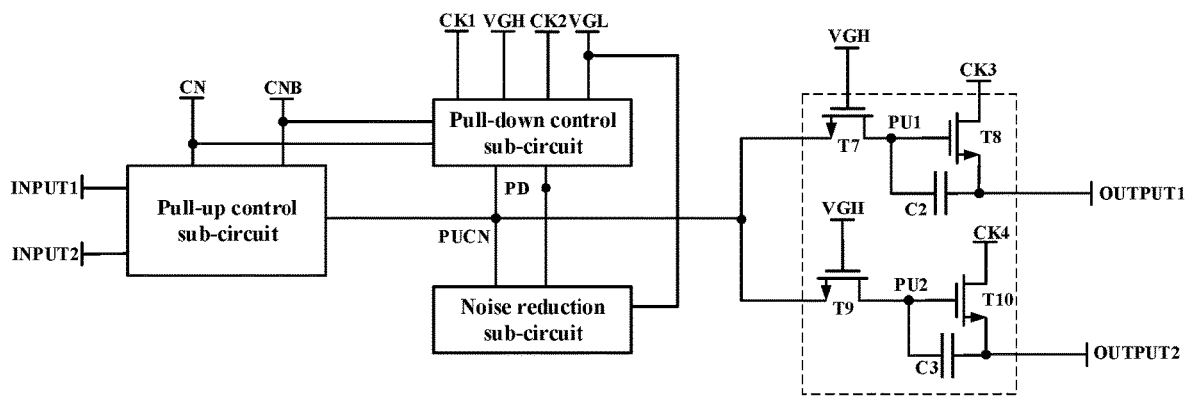
FIG. 5 is a diagram of an equivalent circuit of an output sub-circuit according to an exemplary embodiment.

FIG. 5 is an equivalent circuit diagram of an output sub-circuit according to an exemplary embodiment. As shown in FIG. 5, the first output sub-circuit in the output sub-circuit according to the exemplary embodiment may include a seventh transistor T7, an eighth transistor T8 and a second capacitor C2. The second output sub-circuit may include a ninth transistor T9, a tenth transistor T10 and a third capacitor C3.

In an exemplary embodiment, a control electrode of the seventh transistor T7 is electrically connected with the first power supply terminal VGH, a first electrode of the seventh transistor T7 is electrically connected with the pull-up control node PUCN, and a second electrode of the seventh transistor T7 is electrically connected with the first pull-up node PU1. A control electrode of the eighth transistor T8 is electrically connected with the first pull-up node PU1, a first electrode of the eighth transistor T8 is electrically connected with the third clock signal terminal CK3, and a second electrode of the eighth transistor T8 is electrically connected with the first output terminal OUTPUT1. A first electrode of the second capacitor C2 is electrically connected with the first pull-up node PU1, and a second electrode of the second capacitor C2 is electrically connected with the first output terminal OUTPUT1. A control electrode of the ninth transistor T9 is electrically connected with the first power supply terminal VGH, a first electrode of the ninth transistor T9 is electrically connected with the pull-up control node PUCN, and a second electrode of the ninth transistor T9 is electrically connected with the second pull-up node PU2. A control electrode of the tenth transistor T10 is electrically connected with the second pull-up node PU2, a first electrode of the tenth transistor T10 is electrically connected with the fourth clock signal terminal CK4, and a second electrode of the tenth transistor T10 is electrically connected with the second output terminal OUTPUT2. A first electrode of the third capacitor C3 is electrically connected with the second pull-up node PU2, and a second electrode of the third capacitor C3 is electrically connected with the second output terminal OUTPUT2.

In this embodiment, FIG. 5 shows an exemplary structure of an output sub-circuit, and the present disclosure is not limited thereto.

Figure 6:
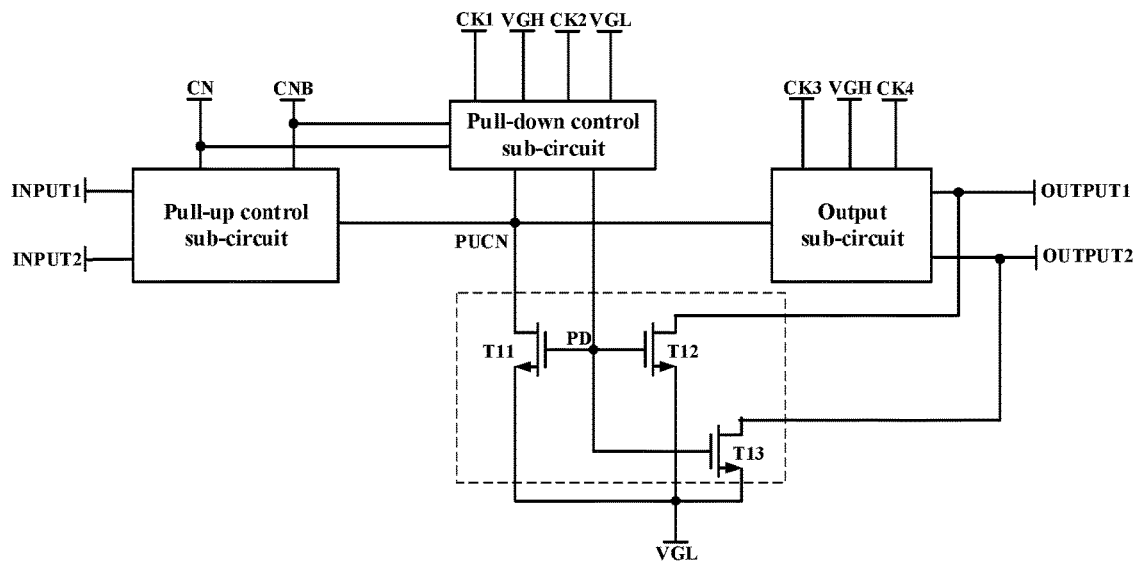
FIG. 6 is a diagram of an equivalent circuit of a noise reduction sub-circuit according to an exemplary embodiment.

FIG. 6 is a diagram of an equivalent circuit of a noise reduction sub-circuit according to an exemplary embodiment. As shown in FIG. 6, the noise reduction sub-circuit according to the exemplary embodiment may include an eleventh transistor T11, a twelfth transistor T12 and a thirteenth transistor T13.

In an exemplary embodiment, a control electrode of the eleventh transistor T11 is electrically connected with the pull-down node PD, a first electrode of the eleventh transistor T11 is electrically connected with the pull-up control node PUCN, and a second electrode of the eleventh transistor T11 is electrically connected with the second power supply terminal VGL. A control electrode of the twelfth transistor T12 is electrically connected with the pull-down node PD, a first electrode of the twelfth transistor T12 is electrically connected with the first output terminal OUTPUT1, and a second electrode of the twelfth transistor T12 is electrically connected with the second power supply terminal VGL. A control electrode of the thirteenth transistor T13 is electrically connected with the pull-down node PD, a first electrode of the thirteenth transistor T13 is electrically connected with the second output terminal OUTPUT2, and a second electrode of the thirteenth transistor T13 is electrically connected with the second power supply terminal VGL.

In this embodiment, FIG. 6 shows an exemplary structure of a noise reduction sub-circuit, and the present disclosure is not limited thereto.

Figure 7:
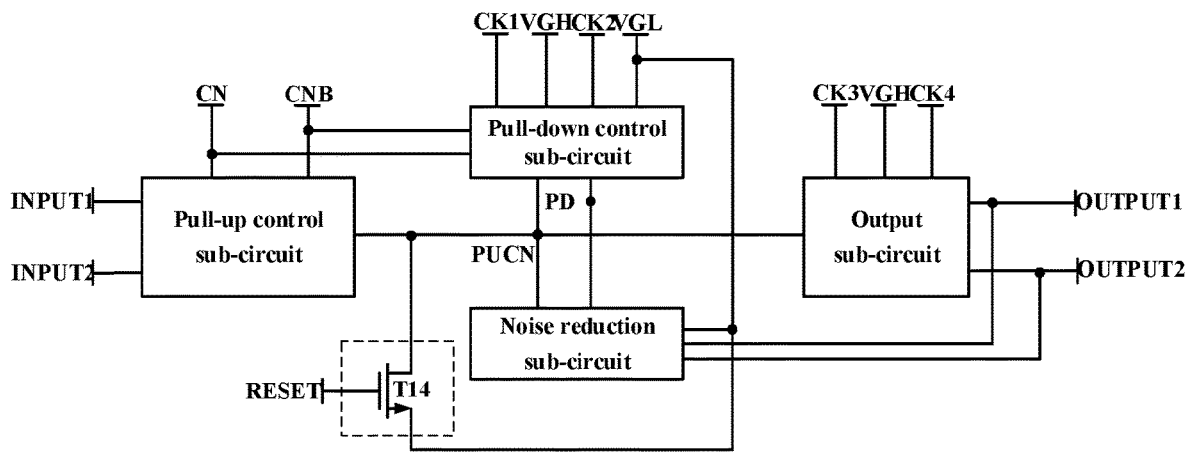
FIG. 7 is a diagram of an equivalent circuit of a reset sub-circuit according to an exemplary embodiment.

FIG. 7 is an equivalent circuit diagram of a reset sub-circuit according to an exemplary embodiment. As shown in FIG. 7, the reset sub-circuit according to the exemplary embodiment may include a fourteenth transistor T14.

In an exemplary embodiment, a control electrode of the fourteenth transistor T14 is electrically connected with the reset signal terminal RESET, a first electrode of the fourteenth transistor T14 is electrically connected with the pull-up control node PUCN, and a second electrode of the fourteenth transistor T14 is electrically connected with the second power supply terminal VGL.

In this embodiment, FIG. 7 shows an exemplary structure of a reset sub-circuit, and the present disclosure is not limited thereto.

Figure 8:
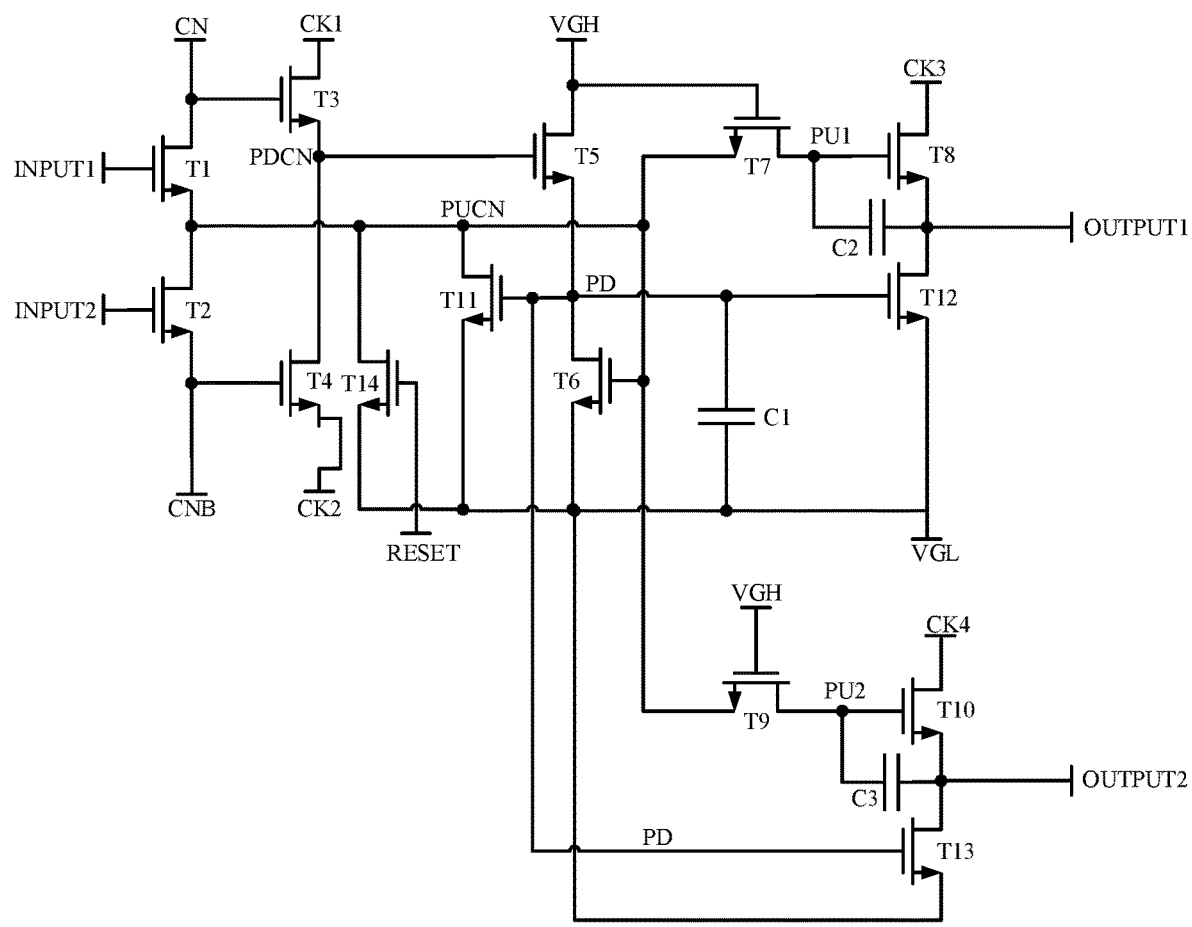
FIG. 8 is a diagram of an equivalent circuit of a shift register according to an exemplary embodiment.

FIG. 8 is an equivalent circuit diagram of a shift register according to an exemplary embodiment. As shown in FIG. 8, the shift register according to the exemplary embodiment may further include a reset sub-circuit; the pull-up control sub-circuit includes a first transistor T1 and a second transistor T2; the pull-down control sub-circuit includes a third transistor T3, a fourth transistor T4, a fifth transistor T5, a sixth transistor T6 and a first capacitor; the output sub-circuit includes a seventh transistor T7, an eighth transistor T8, a second capacitor, a ninth transistor T9, a tenth transistor T10, and a third capacitor; the noise reduction sub-circuit includes an eleventh transistor T11, a twelfth transistor T12, and a thirteenth transistor T13; the reset sub-circuit includes a fourteenth transistor T14.

In an exemplary embodiment, a control electrode of the first transistor T1 is electrically connected with the first input terminal INPUT, a first electrode of the first transistor T1 is electrically connected with the first signal terminal CN, and a second electrode of the first transistor T1 is electrically connected with the pull-up control node PUCN. a control electrode of the second transistor T2 is electrically connected with the second input terminal INPUT2, a first electrode of the second transistor T2 is electrically connected with the second signal terminal CNB, and a second electrode of the second transistor T2 is electrically connected with the pull-up control node PUCN. A control electrode of the third transistor T3 is electrically connected with the first signal terminal CN, a first electrode of the third transistor T3 is electrically connected with the first clock signal terminal CK1, and a second electrode of the third transistor T3 is electrically connected with the pull-down control node PDCN. A control electrode of the fourth transistor T4 is electrically connected with the second signal terminal CNB, a first electrode of the fourth transistor T4 is electrically connected with the second clock signal terminal CK2, and a second electrode of the fourth transistor T4 is electrically connected with the pull-down control node PDCN. A control electrode of the fifth transistor T5 is electrically connected with the pull-down control node PDCN, a first electrode of the fifth transistor T5 is electrically connected with the first power supply terminal VGH, and a second electrode of the fifth transistor T5 is electrically connected with the pull-down node PD. A control electrode of the sixth transistor T6 is electrically connected with the pull-up control node PUCN, a first electrode of the sixth transistor T6 is electrically connected with the pull-down node PD, and a second electrode of the sixth transistor T6 is electrically connected with the second power supply terminal VGL. A first electrode of the first capacitor is electrically connected with the pull-down node PD, and a second electrode of the first capacitor is electrically connected with the second power supply terminal VGL. A control electrode of the seventh transistor T7 is electrically connected with the first power supply terminal VGH, a first electrode of the seventh transistor T7 is electrically connected with the pull-up control node PUCN, and a second electrode of the seventh transistor T7 is electrically connected with the first pull-up node PU1. A control electrode of the eighth transistor T8 is electrically connected with the first pull-up node PU1, a first electrode of the eighth transistor T8 is electrically connected with the third clock signal terminal CK3, and a second electrode of the eighth transistor T8 is electrically connected with the first output terminal OUTPUT1. A first electrode of the second capacitor is electrically connected with the first pull-up node PU1, and a second electrode of the second capacitor is electrically connected with the first output terminal OUTPUT1. A control electrode of the ninth transistor T9 is electrically connected with the first power supply terminal VGH, a first electrode of the ninth transistor T9 is electrically connected with the pull-up control node PUCN, and a second electrode of the ninth transistor T9 is electrically connected with the second pull-up node PU2. A control electrode of the tenth transistor T10 is electrically connected with the second pull-up node PU2, a first electrode of the tenth transistor T10 is electrically connected with the fourth clock signal terminal CK4, and a second electrode of the tenth transistor T10 is electrically connected with the second output terminal OUTPUT2. A first electrode of the third capacitor is electrically connected with the second pull-up node PU2, and a second electrode of the third capacitor is electrically connected with the second output terminal OUTPUT2. A control electrode of the eleventh transistor T11 is electrically connected with the pull-down node PD, a first electrode of the eleventh transistor T11 is electrically connected with the pull-up control node PUCN, and a second electrode of the eleventh transistor T11 is electrically connected with the second power supply terminal VGL. A control electrode of the twelfth transistor T12 is electrically connected with the pull-down node PD, a first electrode of the twelfth transistor T12 is electrically connected with the first output terminal OUTPUT1, and a second electrode of the twelfth transistor T12 is electrically connected with the second power supply terminal VGL. A control electrode of the thirteenth transistor T13 is electrically connected with the pull-down node PD, a first electrode of the thirteenth transistor T13 is electrically connected with the second output terminal OUTPUT2, and a second electrode of the thirteenth transistor T13 is electrically connected with the second power supply terminal VGL. A control electrode of the fourteenth transistor T14 is electrically connected with the reset signal terminal RESET, a first electrode of the fourteenth transistor T14 is electrically connected with the pull-up control node PUCN, and a second electrode of the fourteenth transistor T14 is electrically connected with the second power supply terminal VGL.

In an exemplary embodiment, the first transistor T1 to the fourteenth transistor T14 may be P-type transistors, or may be N-type transistors. Use of the same type of transistors in a pixel drive circuit may simplify a process flow, reduce process difficulties of a display device, and improve a product yield. In some possible implementations, the first transistor T1 to the fourteenth transistor T14 may include P-type transistors and N-type transistors.

A technical solution according to an exemplary embodiment is illustrated below through an operation process of a shift register.

Figure 9:
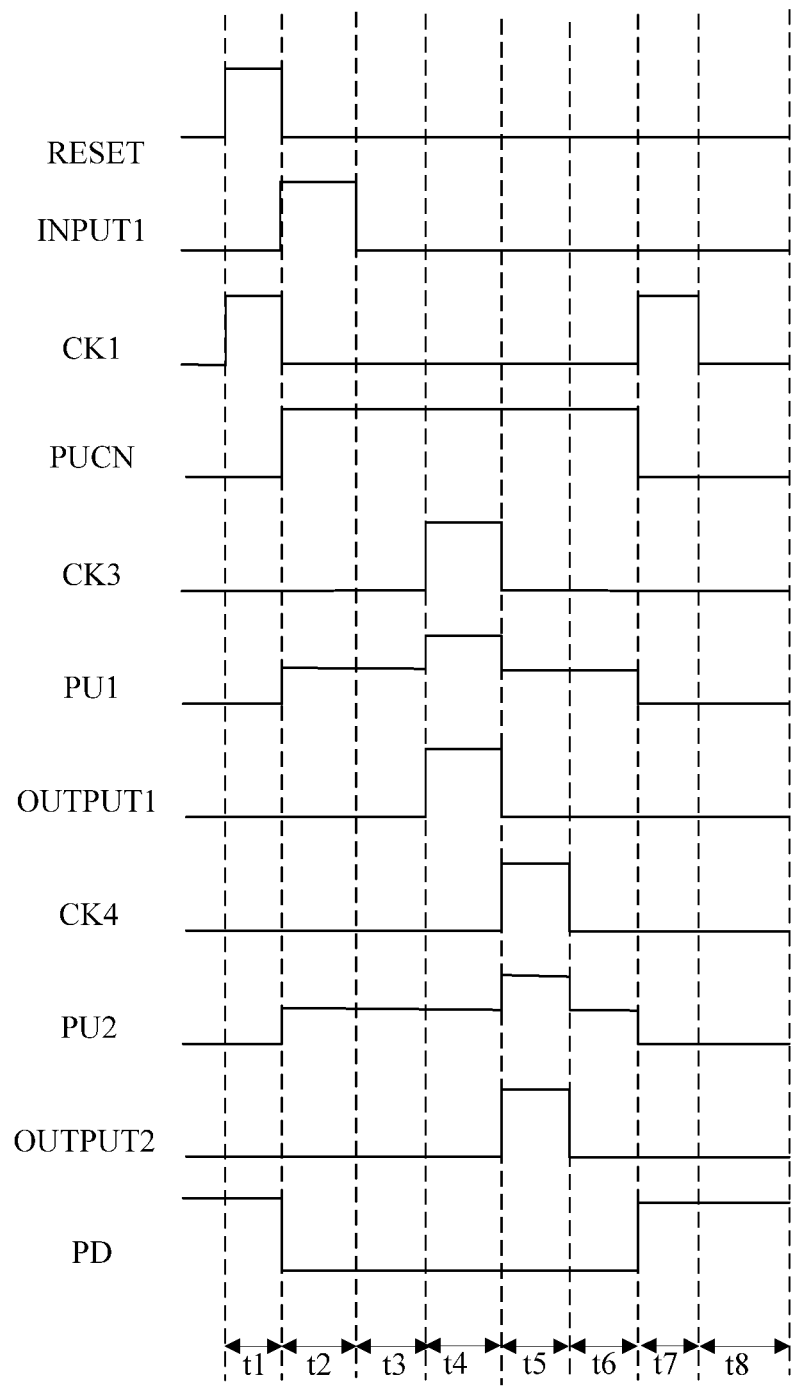
FIG. 9 is a first operating timing chart of a shift register according to an exemplary embodiment.
Figure 10:
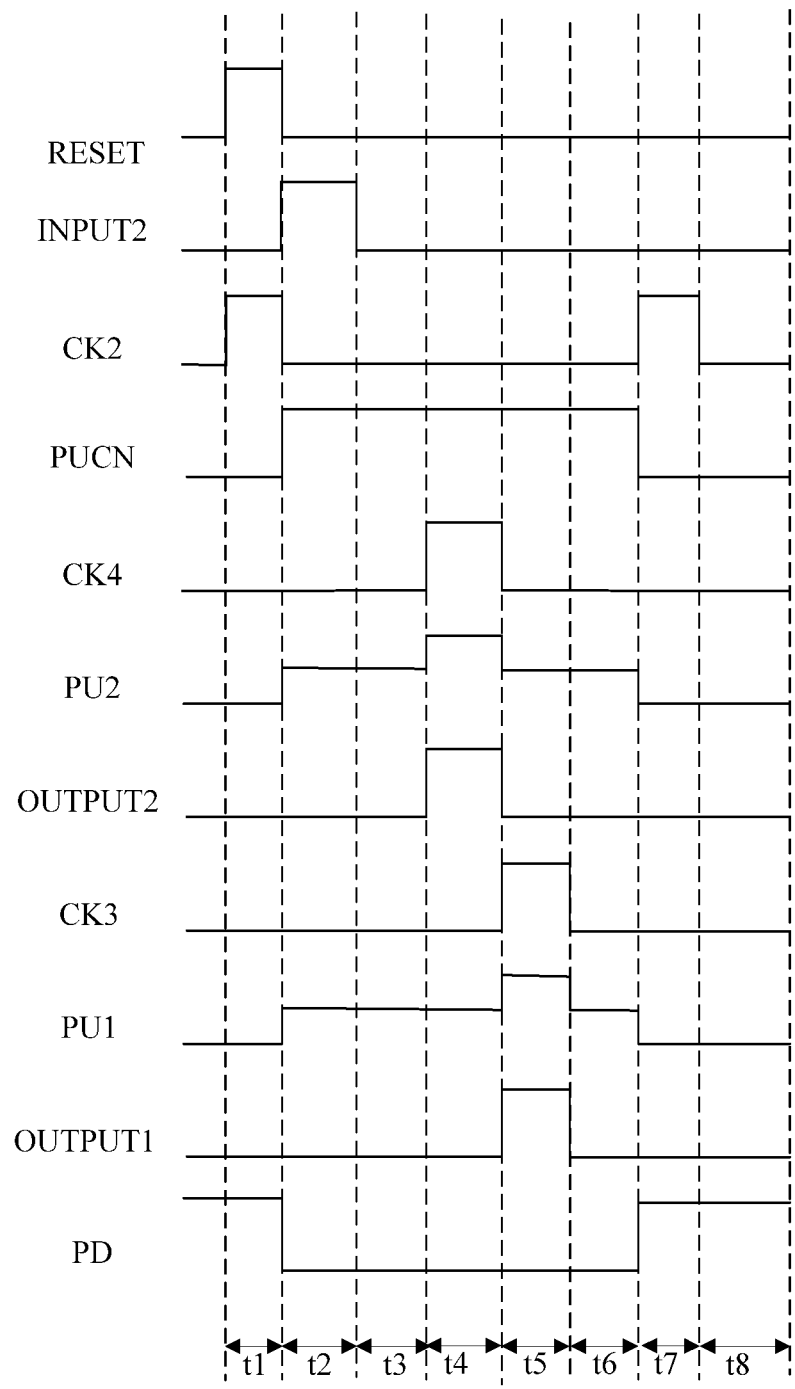
FIG. 10 is a second operating timing chart of a shift register according to an exemplary embodiment.

Taking transistors T1 to T14 in a shift register all being N-type transistors as an example, FIG. 9 is a first operating timing chart of a shift register according to an exemplary embodiment, and FIG. 10 is a second operation timing chart of a shift register according to an exemplary embodiment.

As shown in FIG. 8 to FIG. 10, the shift register according to the exemplary embodiment includes 14 transistors (T1 to T14), 3 capacitors (C1, C2 and C3), 9 signal input terminals (INPUT1, INPUT2, CN, CNB, RESET, CK1, CK2, CK3 and CK4), 2 signal output terminals (OUTPUT1 and OUTPUT2) and 2 power supply terminals (VGH and VGL). FIG. 9 illustrates an operation process of the shift register when the gate driving circuit is performing forward scanning as an example. FIG. 10 illustrates an operation process of the shift register when the gate driving circuit is performing reverse scanning as an example.

In an exemplary embodiment, the first power supply terminal VGH continuously provides a high level signal, and the seventh transistor T7 and the ninth transistor T9 are continuously turned on. The second power supply terminal VGL continuously provides a low level signal.

When the gate driving circuit is in a forward scan mode, the time when an input signal of the second signal terminal CNB of a shift register of the current stage is an effective level signal does not coincide with the time when an input signal of the second clock signal terminal CK2 is an effective level signal. In this case, the pull-up control node PUCN will not be pulled up by the high level signal of the second clock signal terminal CK2, and the output of the shift register of this stage will not be affected.

When the gate driving circuit is performing forward scanning, as shown in FIGS. 8 and 9, the operation process of the shift register may include:

In a first stage t1, that is, a reset stage, input signals of the reset signal terminal RESET, the first signal terminal CN and the first clock signal terminal CK1 of the signal input terminals are high level signals, and input signals of the first input terminal INPUT1, the third clock signal terminal CK3 and the fourth clock signal terminal CK4 are low level signals. The input signal of the reset signal terminal RESET is a high level signal, the fourteenth transistor T14 is turned on, the low level signal of the second power supply terminal VGL is written into the pull-up control node PUCN to reset the pull-up control node PUCN, the sixth transistor T6 is turned off, the low level signal of the second power supply terminal VGL cannot be written into the pull-down node PD, the input signal of the first signal terminal CN is a high level signal, the high level signal of the first clock signal terminal CK1 is written into the pull-down control node PDCN, the tenth transistor T10 is turned on, the high level signal of the first power supply terminal VGH is written into the pull-down node PD, and the eleventh transistor T11, the twelfth transistor T12 and the thirteenth transistor T13 are turned on to reset the pull-up control node, the first output terminal and the second output terminal.

In a second stage t2, that is, an input stage, the input signals of the first input terminal INPUT1 and the first signal terminal CN of the signal input terminals are high level signals, and the input signals of the first clock signal terminal CK1, the third clock signal terminal CK3, the fourth clock signal terminal CK4 and the reset signal terminal RESET are low level signals. The input signal of the first input terminal INPUT1 is a high level signal, the first transistor T1 is turned on, the high level signal of the first signal terminal CN is written into the pull-up control node PUCN, the seventh transistor T7 and the ninth transistor T9 are continuously turned on, the high level signal of the pull-up control node PUCN is written into the first pull-up node PU1 and the second pull-up node PU2, meanwhile the second capacitor C1 and the third capacitor C3 are charged, the eighth transistor T8 and the tenth transistor T10 are turned on, the low level signal of the third clock signal terminal CK3 is written into the first output terminal OUTPUT1, and the low level signal of the fourth clock signal terminal CK4 is written into the second output terminal OUTPUT2. In addition, the input signal of the first signal terminal CN is a high level signal, the third transistor T3 is turned on, the low level signal of the first clock signal terminal CK1 is written into the pull-down control node PDCN, the fifth transistor T5 is turned off, the high level signal of the first power supply terminal VGH cannot be written into the pull-down node PD. The signal of the pull-up control node PUCN is a high level signal, the sixth transistor T6 is turned on, a potential of the pull-down node PD is pulled down by the low level signal of the second power supply terminal VLG, and the eleventh transistor T11, the twelfth transistor T12 and the thirteenth transistor T13 are turned off. In this stage, the first output terminal OUTPUT1 and the second output terminal OUTPUT2 output low level signals.

In a third stage t3, the input signals of the first input terminal INPUT1, the first signal terminal CN, the first clock signal terminal CK1, the third clock signal terminal CK3, the fourth clock signal terminal CK4 and the reset signal terminal RESET of the signal input terminals are low level signals. The input signal of the first input terminal INPUT1 is a low level signal, the first transistor T1 is turned off, the pull-up control node PUCN keeps the high level signal of the previous stage, the seventh transistor T7 and the ninth transistor T9 are continuously turned on, the high level signal of the pull-up control node PUCN is written into the first pull-up node PU1 and the second pull-up node PU2, meanwhile the second capacitor C2 and the third capacitor C3 are charged. The eighth transistor T8 and the tenth transistor T10 are turned on, the low level signal of the third clock signal terminal CK3 is written into the first output terminal OUTPUT1, and the low level signal of the fourth clock signal terminal CK4 is written into the second output terminal OUTPUT2. In addition, the input signal of the first signal terminal CN is a low level signal, the third transistor T3 is turned off, the signal of the pull-up control node PUCN is a high level signal, the eighth transistor T8 and the sixth transistor T6 are turned on, the potential of the pull-down node PD is pulled down by the low level signal of the second power supply terminal VLG, and remains at a low level, and the eleventh transistor T11, the twelfth transistor T12 and the thirteenth transistor T13 are turned off. In this stage, the first output terminal OUTPUT1 and the second output terminal OUTPUT2 still output low level signals.

In a fourth stage t4, that is, a first output stage, the input signal of the third clock signal terminal CK3 of the signal input terminals is a high level signal, and the input signals of the first input terminal INPUT1, the first signal terminal CN, the first clock signal terminal CK1, the fourth clock signal terminal CK4 and the reset signal terminal RESET are low level signals. The input signal of the first input terminal INPUT1 is a low level signal, the first transistor T1 is turned off, the pull-up control node PUCN keeps the high level signal of the previous stage, the seventh transistor T7 and the ninth transistor T9 are continuously turned on. Since the input signal of the third clock signal terminal CK3 is a high level signal, the first pull-up node PU1 is raised under the action of the level bootstrap of the signal of the second capacitor C2. The input signal of the fourth clock signal terminal CK4 is a low level signal, the second pull-up node PU2 maintains the high level signal of the previous stage, the eighth transistor T8 and the tenth transistor T10 are turned on, the high level signal of the third clock signal terminal CK3 is written into the first output terminal OUTPUT1, and the low level signal of the fourth clock signal terminal CK4 is written into the second output terminal OUTPUT2. In addition, the input signal of the first signal terminal CN is a low level signal, the third transistor T3 is turned off, the signal of the pull-up control node PUCN is a high level signal, the sixth transistor T6 is turned on, the potential of the pull-down node PD is continuously pulled down by the low level signal of the second power supply terminal VLG, and remains at the low level, and the eleventh transistor T11, the twelfth transistor T12 and the thirteenth transistor T13 are turned off. In this stage, an output signal of the first output terminal OUTPUT1 is a high level signal, and an output signal of the second output terminal OUTPUT2 is a low level signal.

In a fifth stage t5, that is, a second output stage, the input signal of the fourth clock signal terminal CK4 of the signal input terminals is a high level signal, and the input signals of the first input terminal INPUT1, the first signal terminal CN, the first clock signal terminal CK1, the third clock signal terminal CK3 and the reset signal terminal RESET are low level signals. The input signal of the first input terminal INPUT1 is a low level signal, the first transistor T1 is turned off, the pull-up control node PUCN still keeps the high level signal of the previous stage, the seventh transistor T7 and the ninth transistor T9 are continuously turned on. Since the input signal of the third clock signal terminal CK3 is a low level signal, the first pull-up node PU1 is restored to the high level signal of the first stage. The input signal of the fourth clock signal terminal CK4 is a high level signal, the level of the signal of the second pull-up node PU2 is raised by the bootstrap of the third capacitor C3, the eighth transistor T8 and the tenth transistor T10 are turned on, the low level signal of the third clock signal terminal CK3 is written into the first output terminal OUTPUT1, and the high level signal of the fourth clock signal terminal CK4 is written into the second output terminal OUTPUT2. In addition, the input signal of the first signal terminal CN is a low level signal, the third transistor T3 is turned off, the signal of the pull-up control node PUCN is a high level signal, the sixth transistor T6 is turned on, the potential of the pull-down node PD is continuously pulled down by the low level signal of the second power supply terminal VLG, and remains at the low level, and the eleventh transistor T11, the twelfth transistor T12 and the thirteenth transistor T13 are turned off. In this stage, the output signal of the first output terminal OUTPUT1 is a low level signal, and the output signal of the second output terminal OUTPUT2 is a high level signal.

In a sixth stage t6, the input signals of the first input terminal INPUT1, the first signal terminal CN, the first clock signal terminal CK1, the third clock signal terminal CK3, the fourth clock signal terminal CK4 and the reset signal terminal RESET of the signal input terminals are low level signals. The input signal of the first input terminal INPUT1 is a low level signal, the first transistor T1 is turned off, the pull-up control node PUCN still keeps the high level signal of the previous stage, the seventh transistor T7 and the ninth transistor T9 are continuously turned on. Since the input signal of the third clock signal terminal CK3 is a low level signal, the first pull-up node PU1 is restored to the high level signal of the first stage. The input signal of the fourth clock signal terminal CK4 is a low level signal, the second pull-up node PU2 is restored to the high level signal of the first stage, the eighth transistor T8 and the tenth transistor T10 are turned on, the low level signal of the third clock signal terminal CK3 is written into the first output terminal OUTPUT1, and the low level signal of the fourth clock signal terminal CK4 is written into the second output terminal OUTPUT2. In addition, the input signal of the first signal terminal CN is a low level signal, the third transistor T3 is turned off, the signal of the pull-up control node PUCN is a high level signal, the sixth transistor T6 is turned on, the potential of the pull-down node PD is continuously pulled down by the low level signal of the second power supply terminal VLG, and remains at the low level, and the eleventh transistor T11, the twelfth transistor T12 and the thirteenth transistor T13 are turned off. In this stage, the output signals of the first output terminal OUTPUT1 and the second output terminal OUTPUT2 are low level signals.

In a seventh stage t7, that is, a noise reduction stage, the input signals of the first signal terminal CN and the first clock signal terminal CK1 of the signal input terminals are high level signals, and the input signals of the first input terminal INPUT1, the third clock signal terminal CK3, the fourth clock signal terminal CK4 and the reset signal terminal RESET are low level signals. The input signal of the first signal terminal CN is a high level signal, the third transistor T3 is turned on, the high level signal of the first clock signal terminal CK1 is written into the pull-down control node PDCN. The fifth transistor T5 is turned on, the high level signal of the first power supply terminal VGH is written into the pull-down node PD. The eleventh transistor T11 is turned on, the low level signal of the second power supply terminal VGL is written into the pull-up control node PDCN. At this time, the sixth transistor T6 is turned off, the low level signal of the second power supply terminal VGL cannot be written into the pull-down node PD, the seventh transistor T7 and the ninth transistor T9 are continuously turned on, potentials of the first pull-up node PU1 and the second pull-up node PU2 are pulled down. The eighth transistor T8 and the tenth transistor T10 are turned off, the twelfth transistor T12 is turned on, the signal of the first output terminal OUTPUT1 is pulled down by the low level signal of the second power supply terminal VGL. The thirteenth transistor T13 is turned on, and the signal of the second output terminal OUTPUT2 is pulled down by the low level signal of the second power supply terminal VGL. In this stage, the output signals of the first output terminal OUTPUT1 and the second output terminal OUTPUT2 are low level signals.

In an eighth stage t8, the input signals of the first signal terminal CN, the first clock signal terminal CK1, the first input terminal INPUT1, the third clock signal terminal CK3, the fourth clock signal terminal CK4 and the reset signal terminal RESET of the signal input terminals are low level signals. The input signal of the first signal terminal CN is a low level signal, the third transistor T3 is turned off, the first capacitor C1 starts discharging, the pull-down control node PDCN keeps the high level signal of the previous stage, the fifth transistor T5 is turned on, the high level signal of the first power supply terminal VGH is written into the pull-down node PD, the eleventh transistor T11 is turned on, the low level signal of the second power supply terminal VGL is written into the pull-up control node PDCN, the sixth transistor T6 is turned off, the low level signal of the second power supply terminal VGL cannot be written into the pull-down node PD, the seventh transistor T7 and the ninth transistor T9 are continuously turned on, potentials of the first pull-up node PU1 and the second pull-up node PU2 are pulled down, the eighth transistor T8 and the tenth transistor T110 are turned off, the twelfth transistor T12 is turned on, the signal of the first output terminal OUTPUT1 is pulled down by the low level signal of the second power supply terminal VGL, the thirteenth transistor T13 is turned on, and the signal of the second output terminal OUTPUT2 is pulled down by the low level signal of the second power supply terminal VGL. In this stage, the output signals of the first output terminal OUTPUT1 and the second output terminal OUTPUT2 are low level signals.

When the gate driving circuit is in a reverse scan mode, the time when the input signal of the first signal terminal CN of the shift register of the current stage is an effective level signal does not coincide with the time when the input signal of the first clock signal terminal CK1 is an effective level signal. In this case, the pull-up control node PUCN will not be pulled up by the high level signal of the first clock signal terminal CK1, and the output of the shift register of this stage will not be affected.

When the gate driving circuit is performing reverse scanning, as shown in FIGS. 8 and 10, an operation process of the shift register may include:

In a first stage t1, that is, a reset stage, input signals of the reset signal terminal RESET, the second signal terminal CNB and the second clock signal terminal CK2 of the signal input terminals are high level signals, and the input signals of the first input terminal INPUT1, the third clock signal terminal CK3 and the fourth clock signal terminal CK4 are low level signals. The input signal of the reset signal terminal RESET is a high level signal, the fourteenth transistor T14 is turned on, the low level signal of the second power supply terminal VGL is written into the pull-up control node PUCN to reset the pull-up control node PUCN, the sixth transistor T6 is turned off, the low level signal of the second power supply terminal VGL cannot be written into the pull-down node PD, the input signal of the second signal terminal CNB is a high level signal, the high level signal of the second clock signal terminal CK2 is written into the pull-down control node PDCN, the tenth transistor T10 is turned on, the high level signal of the first power supply terminal VGH is written into the pull-down node PD, and the eleventh transistor T11, the twelfth transistor T12 and the thirteenth transistor T13 are turned on to reset the pull-up control node, the first output terminal and the second output terminal.

In a second stage t2, that is, an input stage, the input signals of the first input terminal INPUT1 and the second signal terminal CNB of the signal input terminals are high level signals, and the input signals of the second clock signal terminal CK2, the third clock signal terminal CK3, the fourth clock signal terminal CK4 and the reset signal terminal RESET are low level signals. The input signal of the first input terminal INPUT1 is a high level signal, the second transistor T2 is turned on, the high level signal of the second signal terminal CNB is written into the pull-up control node PUCN, the seventh transistor T7 and the ninth transistor T9 are continuously turned on, the high level signal of the pull-up control node PUCN is written into the first pull-up node PU1 and the second pull-up node PU2, meanwhile the second capacitor C1 and the third capacitor C3 are charged, the eighth transistor T8 and the tenth transistor T10 are turned on, the low level signal of the third clock signal terminal CK3 is written into the first output terminal OUTPUT1, and the low level signal of the fourth clock signal terminal CK4 is written into the second output terminal OUTPUT2. In addition, the input signal of the second signal terminal CNB is a high level signal, the fourth transistor T4 is turned on, the low level signal of the second clock signal terminal CK2 is written into the pull-down control node PDCN, the fifth transistor T5 is turned off, the high level signal of the first power supply terminal VGH cannot be written into the pull-down node PD, the signal of the pull-up control node PUCN is a high level signal, the sixth transistor T6 is turned on, a potential of the pull-down node PD is pulled down by the low level signal of the second power supply terminal VLG, and the eleventh transistor T11, the twelfth transistor T12 and the thirteenth transistor T13 are turned off. In this stage, the first output terminal OUTPUT1 and the second output terminal OUTPUT2 output low level signals.

In a third stage t3, the input signals of the first input terminal INPUT1, the second signal terminal CNB, the second clock signal terminal CK2, the third clock signal terminal CK3, the fourth clock signal terminal CK4 and the reset signal terminal RESET of the signal input terminals are low level signals. The input signal of the first input terminal INPUT1 is a low level signal, the second transistor T2 is turned off, the pull-up control node PUCN keeps the high level signal of the previous stage, the seventh transistor T7 and the ninth transistor T9 are continuously turned on, the high level signal of the pull-up control node PUCN is written into the first pull-up node PU1 and the second pull-up node PU2, meanwhile the second capacitor C2 and the third capacitor C3 are charged, the eighth transistor T8 and the tenth transistor T10 are turned on, the low level signal of the third clock signal terminal CK3 is written into the first output terminal OUTPUT1, and the low level signal of the fourth clock signal terminal CK4 is written into the second output terminal OUTPUT2. In addition, the input signal of the second signal terminal CNB is a low level signal, the fourth transistor T4 is turned off, the signal of the pull-up control node PUCN is a high level signal, the eighth transistor T8 and the sixth transistor T6 are turned on, the potential of the pull-down node PD is pulled down by the low level signal of the second power supply terminal VLG, and remains at a low level, and the eleventh transistor T11, the twelfth transistor T12 and the thirteenth transistor T13 are turned off. In this stage, the first output terminal OUTPUT1 and the second output terminal OUTPUT2 still output low level signals.

In a fourth stage t4, that is, a first output stage, the input signal of the fourth clock signal terminal CK4 of the signal input terminals is a high level signal, and the input signals of the first input terminal INPUT1, the second signal terminal CNB, the second clock signal terminal CK2, the third clock signal terminal CK3 and the reset signal terminal RESET are low level signals. The input signal of the first input terminal INPUT1 is a low level signal, the second transistor T2 is turned off, the pull-up control node PUCN keeps the high level signal of the previous stage, the seventh transistor T7 and the ninth transistor T9 are continuously turned on. Since the input signal of the fourth clock signal terminal CK4 is a high level signal, the second pull-up node PU2 is raised under the action of the level bootstrap of the signal of the third capacitor C3. The input signal of the third clock signal terminal CK3 is a low level signal, the first pull-up node PU1 maintains the high level signal of the previous stage, the eighth transistor T8 and the tenth transistor T10 are turned on, the low level signal of the third clock signal terminal CK3 is written into the first output terminal OUTPUT1, and the high level signal of the fourth clock signal terminal CK4 is written into the second output terminal OUTPUT2. In addition, the input signal of the second signal terminal CNB is a low level signal, the fourth transistor T4 is turned off, the signal of the pull-up control node PUCN is a high level signal, the sixth transistor T6 is turned on, the potential of the pull-down node PD is continuously pulled down by the low level signal of the second power supply terminal VLG, and remains at the low level, and the eleventh transistor T11, the twelfth transistor T12 and the thirteenth transistor T13 are turned off. In this stage, the output signal of the first output terminal OUTPUT1 is a low level signal, and the output signal of the second output terminal OUTPUT2 is a high level signal.

In a fifth stage t5, that is, a second output stage, the input signal of the third clock signal terminal CK3 of the signal input terminals is a high level signal, and the input signals of the first input terminal INPUT1, the second signal terminal CNB, the second clock signal terminal CK2, the fourth clock signal terminal CK4 and the reset signal terminal RESET are low level signals. The input signal of the first input terminal INPUT1 is a low level signal, the second transistor T2 is turned off, the pull-up control node PUCN still keeps the high level signal of the previous stage, the seventh transistor T7 and the ninth transistor T9 are continuously turned on. Since the input signal of the third clock signal terminal CK3 is a high level signal, a potential of the signal of the first pull-up node PU1 is raised under the action the bootstrap of the second capacitor C2. The input signal of the fourth clock signal terminal CK4 is a low level signal, the signal of the second pull-up node PU2 is restored to the high level signal of the first stage, the eighth transistor T8 and the tenth transistor T10 are turned on, the high level signal of the third clock signal terminal CK3 is written into the first output terminal OUTPUT1, and the low level signal of the fourth clock signal terminal CK4 is written into the second output terminal OUTPUT2. In addition, the input signal of the second signal terminal CNB is a low level signal, the fourth transistor T4 is turned off, the signal of the pull-up control node PUCN is a high level signal, the sixth transistor T6 is turned on, the potential of the pull-down node PD is continuously pulled down by the low level signal of the second power supply terminal VLG, and remains at the low level, and the eleventh transistor T11, the twelfth transistor T12 and the thirteenth transistor T13 are turned off. In this stage, the output signal of the first output terminal OUTPUT1 is a high level signal, and the output signal of the second output terminal OUTPUT2 is a low level signal.

In a sixth stage t6, the input signals of the first input terminal INPUT1, the second signal terminal CNB, the second clock signal terminal CK2, the third clock signal terminal CK3, the fourth clock signal terminal CK4 and the reset signal terminal RESET of the signal input terminals are low level signals. The input signal of the first input terminal INPUT1 is a low level signal, the second transistor T2 is turned off, the pull-up control node PUCN still keeps the high level signal of the previous stage, the seventh transistor T7 and the ninth transistor T9 are continuously turned on. Since the input signal of the third clock signal terminal CK3 is a low level signal, the first pull-up node PU1 is restored to the high level signal of the first stage. The input signal of the fourth clock signal terminal CK4 is a low level signal, the second pull-up node PU2 is restored to the high level signal of the first stage, the eighth transistor T8 and the tenth transistor T10 are turned on, the low level signal of the third clock signal terminal CK3 is written into the first output terminal OUTPUT1, and the low level signal of the fourth clock signal terminal CK4 is written into the second output terminal OUTPUT2. In addition, the input signal of the second signal terminal CNB is a low level signal, the fourth transistor T4 is turned off, the signal of the pull-up control node PUCN is a high level signal, the sixth transistor T6 is turned on, the potential of the pull-down node PD is continuously pulled down by the low level signal of the second power supply terminal VLG, and remains at the low level, and the eleventh transistor T11, the twelfth transistor T12 and the thirteenth transistor T13 are turned off. In this stage, the output signals of the first output terminal OUTPUT1 and the second output terminal OUTPUT2 are low level signals.

In a seventh stage t7, that is, a noise reduction stage, the input signals of the second signal terminal CNB and the second clock signal terminal CK2 of the signal input terminals are high level signals, and the input signals of the first input terminal INPUT1, the third clock signal terminal CK3, the fourth clock signal terminal CK4 and the reset signal terminal RESET are low level signals. The input signal of the second signal terminal CNB is a high level signal, the fourth transistor T4 is turned on, the high level signal of the second clock signal terminal CK2 is written into the pull-down control node PDCN, the fifth transistor T5 is turned on, the high level signal of the first power supply terminal VGH is written into the pull-down node PD, the eleventh transistor T11 is turned on, the low level signal of the second power supply terminal VGL is written into the pull-up control node PDCN. At this time, the sixth transistor T6 is turned off, the low level signal of the second power supply terminal VGL cannot be written into the pull-down node PD, the seventh transistor T7 and the ninth transistor T9 are continuously turned on, potentials of the first pull-up node PU1 and the second pull-up node PU2 are pulled down, the eighth transistor T8 and the tenth transistor T10 are turned off, the twelfth transistor T12 is turned on, the signal of the first output terminal OUTPUT1 is pulled down by the low level signal of the second power supply terminal VGL, the thirteenth transistor T13 is turned on, and the signal of the second output terminal OUTPUT2 is pulled down by the low level signal of the second power supply terminal VGL. In this stage, output signals of the first output terminal OUTPUT1 and the second output terminal OUTPUT2 are low level signals.

In an eighth stage t8, the input signals of the second signal terminal CNB, the second clock signal terminal CK2, the first input terminal INPUT1, the third clock signal terminal CK3, the fourth clock signal terminal CK4 and the reset signal terminal RESET of the signal input terminals are low level signals. The input signal of the second signal terminal CNB is a low level signal, the fourth transistor T4 is turned off, the first capacitor C1 starts discharging, the pull-down control node PDCN keeps the high level signal of the previous stage, the fifth transistor T5 is turned on, the high level signal of the first power supply terminal VGH is written into the pull-down node PD, the eleventh transistor T11 is turned on, the low level signal of the second power supply terminal VGL is written into the pull-up control node PDCN, the sixth transistor T6 is turned off, the low level signal of the second power supply terminal VGL cannot be written into the pull-down node PD, the seventh transistor T7 and the ninth transistor T9 are continuously turned on, the potentials of the first pull-up node PU1 and the second pull-up node PU2 are pulled down, the eighth transistor T8 and the tenth transistor T110 are turned off, the twelfth transistor T12 is turned on, the signal of the first output terminal OUTPUT1 is pulled down by the low level signal of the second power supply terminal VGL, the thirteenth transistor T13 is turned on, and the signal of the second output terminal OUTPUT2 is pulled down by the low level signal of the second power supply terminal VGL. In this stage, the output signals of the first output terminal OUTPUT1 and the second output terminal OUTPUT2 are low level signals.

The shift register according to the present disclosure includes 14 transistors and 3 capacitors, and may output two gate driving signals through the first output terminal and the second output terminal, which reduces the number of transistors and capacitors in the gate driving circuit, saves wiring space, and reduces the area occupied by the gate driving circuit, thereby realizing the narrow bezel of the display device and reducing the power consumption. In the present disclosure, when the signal of the pull-up control node is a high level signal, the sixth transistor is turned on, and the potential of the pull-down node PD is pulled down, so that the current path in the shift register may be avoided, and static power consumption generated by the circuit path may be avoided. The power consumption of the shift register according to the embodiment of the present disclosure is reduced by 20% compared with power consumption of a shift register which outputs only one gate driving signal.

Figure 11:
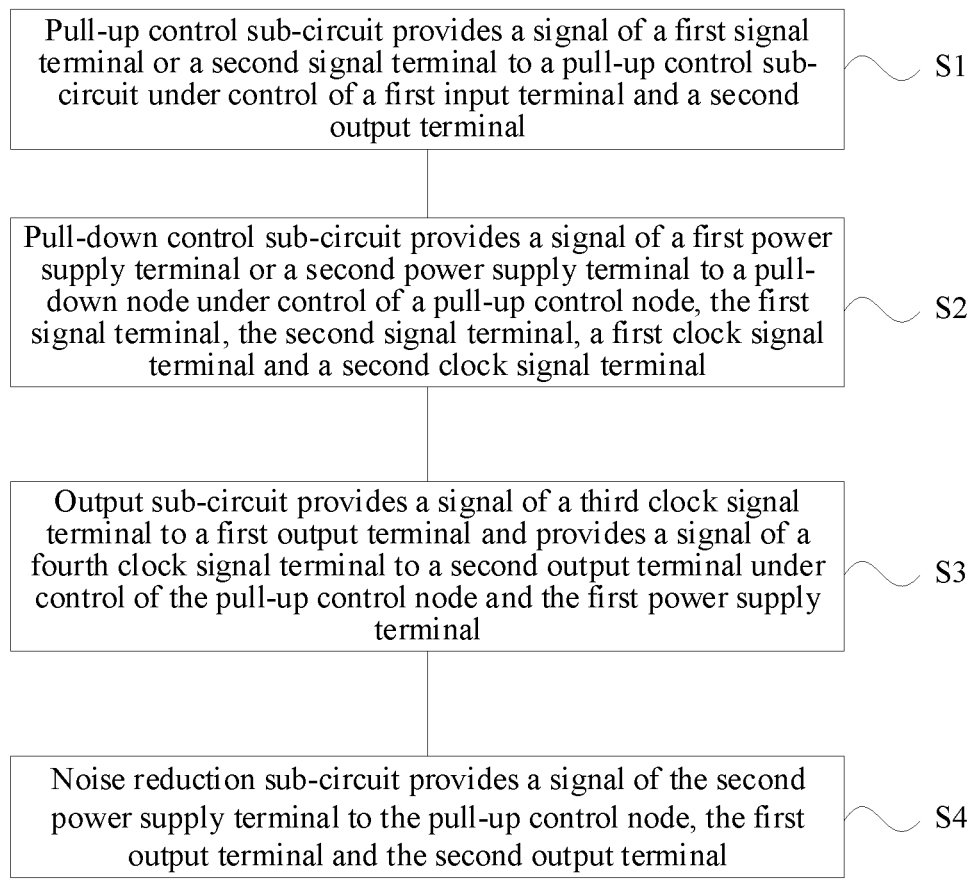
FIG. 11 is a flowchart of a method for driving a shift register according to an embodiment of the present disclosure.

FIG. 11 is a flowchart of a method for driving a shift register according to an embodiment of the present disclosure. As shown in FIG. 11, the method for driving a shift register according to the embodiment of the present disclosure is configured to drive a shift register. The method for driving a shift register according to the embodiment of the present disclosure may include:

S1: a pull-up control sub-circuit provides a signal of a first signal terminal or a second signal terminal to a pull-up control sub-circuit under control of a first input terminal and a second output terminal;

S2: a pull-down control sub-circuit provides a signal of a first power supply terminal or a second power supply terminal to a pull-down node under control of a pull-up control node, the first signal terminal, the second signal terminal, a first clock signal terminal and a second clock signal terminal;

S3: an output sub-circuit provides a signal of a third clock signal terminal to a first output terminal and provides a signal of a fourth clock signal terminal to a second output terminal under control of the pull-up control node and the first power supply terminal; and S4: a noise reduction sub-circuit provides a signal of the second power supply terminal to the pull-up control node, the first output terminal and the second output terminal under control of the pull-down node.

The shift register is a shift register provided in any of the aforementioned embodiments with similar implementation principle and implementation effect, thus will not be described again here.

In an exemplary embodiment, the method for driving the shift register may further include the following: a reset sub-circuit provides a signal of the second power supply terminal to the pull-up control node under control of a reset signal terminal.

Figure 12:
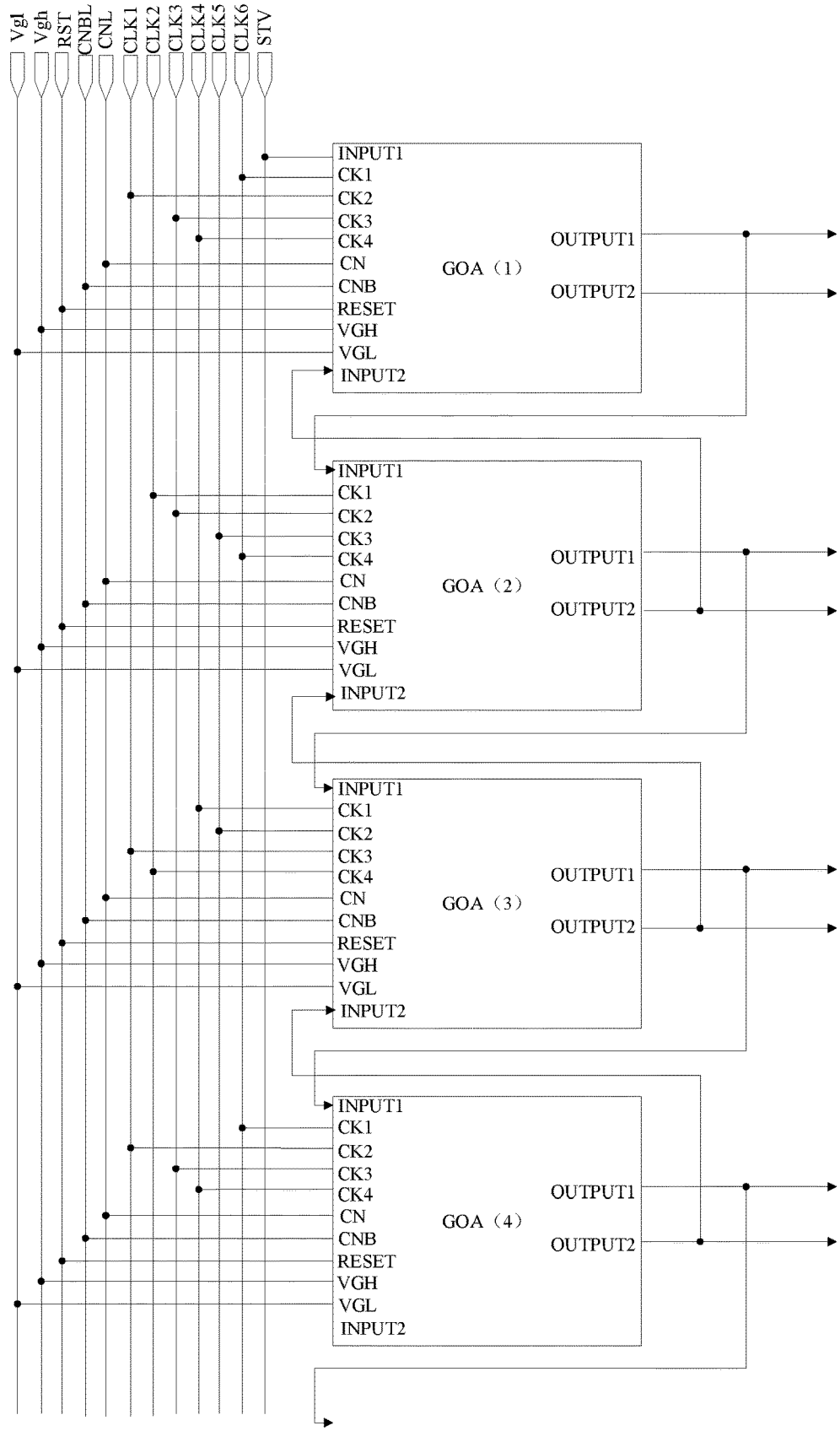
FIG. 12 is a schematic structural diagram of a gate driving circuit according to an embodiment of the present disclosure.

FIG. 12 is a schematic structural diagram of a gate driving circuit according to an embodiment of the present disclosure. As shown in FIG. 12, the gate driving circuit according to the embodiment of the present disclosure includes multiple cascaded shift registers. A first input terminal INPUT1 of an i+1 stage shift register is electrically connected with a first output terminal OUTPUT1 of an i stage shift register, and a second input terminal INPUT2 of the i+1 stage shift register is electrically connected with a second output terminal OUTPUT2 of an i+2 stage shift register.

The shift register is a shift register provided in any of the aforementioned embodiments with similar implementation principle and implementation effect, thus will not be described again here.

In an exemplary embodiment, as shown in FIG. 12, the gate driving circuit may further include an initial signal line STV, a first clock line CLK1, a second clock line CLK2, a third clock line CLK3, a fourth clock line CLK4, a fifth clock line CLK5, a sixth clock line CLK6, a reset signal line RST, a first power supply line Vgh, a second power supply line Vgl, a first signal line CNL, and a second signal line CNBL.

In an exemplary embodiment, reset signal terminals RESET of all shift registers are connected with the reset signal line RST, first power supply terminals VGH of all shift registers are connected with the first power supply line Vgh, second power supply terminals VGL of all shift registers are connected with the second power supply line Vgl, first signal terminals CN of all shift registers are connected with the first signal line CNL, and second signal terminals CNB of all shift registers are connected with the second signal line CNBL.

In an exemplary embodiment, the first input terminal INPUT1 of the first stage shift register GOA (1) is connected with the initial signal line STV.

In an exemplary embodiment, a first clock signal terminal CK1 of a 3i-2 stage shift register GOA (3i-2) is connected with the sixth clock line CLK6, a second clock signal terminal CK2 of the 3i-2 stage shift register GOA (3i-2) is connected with the first clock line CLK1, a third clock signal terminal CK3 of the 3i-2 stage shift register GOA (3i-2) is connected with the third clock line CLK3, a fourth clock signal terminal CK4 of the 3i-2 stage shift register GOA (3i-2) is connected with the fourth clock line CLK4, a first clock signal terminal CK1 of a 3i-1 stage shift register GOA (3i-1) is connected with the second clock line CLK2, a second clock signal terminal CK2 of the 3i-1 shift register GOA (3i-1) is connected with the third clock line CLK3, a third clock signal terminal CK3 of the 3i-1 shift register GOA (3i-1) is connected with the fifth clock line CLK5, a fourth clock signal terminal CK4 of the 3i-1 shift register GOA (3i-1) is connected with the sixth clock line CLK6, a first clock signal terminal CK1 of a 3i shift register GOA (3i) is connected with the fourth clock line CLK4, a second clock signal terminal CK2 of the 3i shift register GOA (3i) is connected with the fifth clock line CLK5, a third clock signal terminal CK3 of the 3i shift register GOA (3i) is connected with the first clock line CLK1, and a fourth clock signal terminal CK4 of the 3i shift register GOA (3i) is connected with the second clock line CLK2. Exemplarily, a first clock signal terminal CK1 of a first stage shift register GOA (1) is connected with the sixth clock line CLK6, a second clock signal terminal CK2 of the first stage shift register GOA (1) is connected with the first clock line CLK1, a third clock signal terminal CK3 of the first stage shift register GOA (1) is connected with the third clock line CLK3, a fourth clock signal terminal CK4 of the first stage shift register GOA (1) is connected with the fourth clock line CLK4, a first clock signal terminal CK1 of a second stage shift register GOA (2) is connected with the second clock line CLK2, a second clock signal terminal CK2 of the second stage shift register GOA (2) is connected with the third clock line CLK3, a third clock signal terminal CK3 of the second stage shift register GOA (2) is connected with the fifth clock line CLK5, a fourth clock signal terminal CK4 of the second stage shift register GOA (2) is connected with the sixth clock line CLK6, a first clock signal terminal CK1 of a third stage shift register GOA (3) is connected with the fourth clock line CLK4, a second clock signal terminal CK2 of the third stage shift register GOA (3) is connected with the fifth clock line CLK5, a third clock signal terminal CK3 of the third stage shift register GOA (3) is connected with the first clock line CLK1, and a fourth clock signal terminal CK4 of the third stage shift register GOA (3) is connected with the second clock line CLK2.

In an exemplary embodiment, a first input terminal INPUT1 of the i+1 stage shift register GOA (i+1) is electrically connected with the second output terminal OUTPUT2 of the i+1 stage shift register GOA (i), and a second input terminal INPUT2 of the i+1 stage shift register GOA (i+1) is electrically connected with the first output terminal OUTPUT1 of the i+2 stage shift register GOA (i+2). For example, the first input terminal INPUT1 of the first stage shift register GOA (1) is connected with the initial signal terminal STV, the first input terminal INPUT1 of the second stage shift register GOA (2) is electrically connected with the second output terminal OUTPUT2 of the first stage shift register GOA (1), the second input terminal INPUT2 of the second stage shift register GOA (2) is electrically connected with the first output terminal OUTPUT1 of the third stage shift register GOA (3), and so on.

Figure 13:
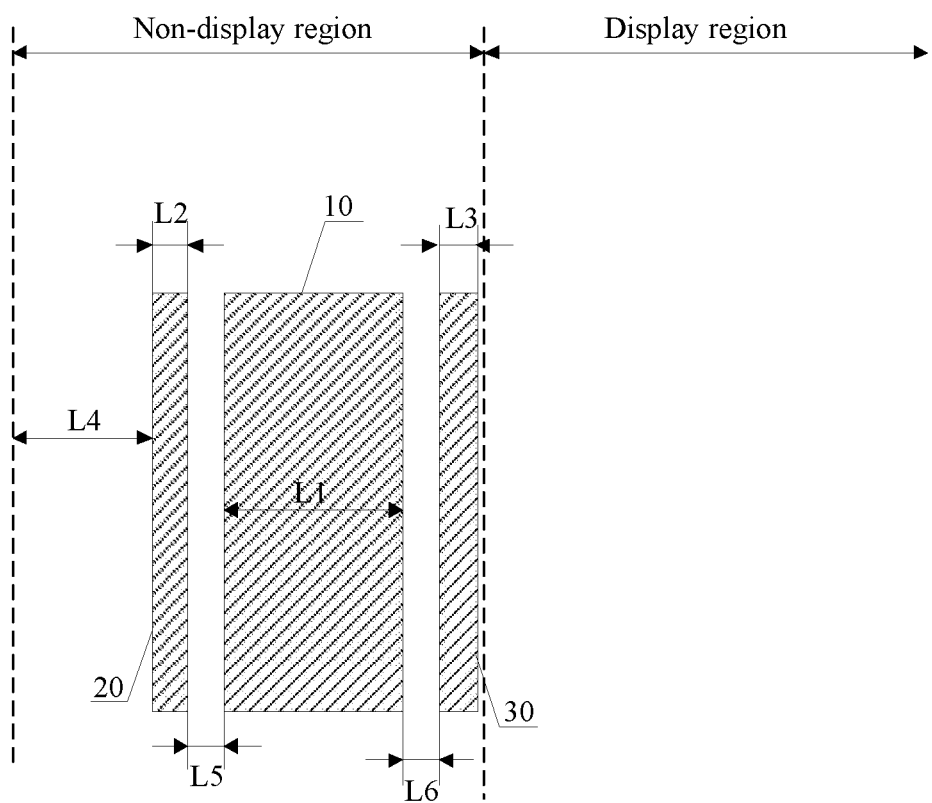
FIG. 13 is a schematic structural diagram of a display device according to an embodiment of the present disclosure.

FIG. 13 is a schematic diagram of a structure of a display device according to an embodiment of the present disclosure. As shown in FIG. 13, an embodiment of the present disclosure further provides a display device, including a gate driving circuit 10 and multiple scan signal lines (not shown in the figures). The scan signal lines extend in a first direction, and the multiple scan signal lines are arranged in a second direction, wherein the first direction and the second direction intersect. The gate driving circuit is electrically connected with the multiple scan signal lines.

In an exemplary embodiment, the display device may be any product or component having a display function such as a mobile phone, a tablet computer, a television, a display, a laptop computer, a digital photo frame, or a navigator.

The gate driving circuit is the gate driving circuit according to any one of the foregoing embodiments, and the implementation principle and implementation effects thereof are similar, which will not be repeated here.

In an exemplary embodiment, a length L1 of the gate driving circuit 10 in the first direction is about 0.35 mm to 0.37 mm. Exemplarily, the length L1 of the gate driving circuit 10 in the first direction may be 0.36 mm.

In an exemplary embodiment, the j stage shift register in the gate driving circuit is connected with the 2j-1 scan signal line and the 2j scan signal line, $1 \leq j \leq N$, N is the number of shift registers included in the gate driving circuit.

In an exemplary embodiment, the display device includes a display region and a non-display region. The gate driving circuit 10 is provided in the non-display region.

In an exemplary embodiment, a length of the non-display region in the first direction may be 0.6 mm to 0.8 mm. Exemplarily, the length of the non-display region in the first direction may be 0.7 mm.

In an exemplary embodiment, as shown in FIG. 13, the non-display region further includes a ground signal line 20 located on a side of the gate driving circuit close to the display region, and a length L2 of the ground signal line 20 in the first direction may be 0.01 mm to 0.03 mm. Exemplarily, the length L2 of the ground signal line 20 in the first direction may be 0.02 mm.

In an exemplary embodiment, a distance L4 between a side of the ground signal line away from the display region and an edge of the non-display region may be 0.15 mm to 0.25 mm. Exemplarily, the distance L4 between the side of the ground signal line away from the display region and the edge of the non-display region may be 0.2 mm.

In an exemplary embodiment, a distance L5 between a side of the ground signal line close to the display region and a side of the gate driving circuit away from the display region may be 0.01 mm to 0.03 mm. Exemplarily, the distance L5 between the side of the ground signal line close to the display region and the side of the gate driving circuit away from the display region may be 0.02 mm.

In an exemplary embodiment, as shown in FIG. 13, the non-display region may further include a virtual pixel region 30. A length L3 of the virtual pixel region 30 in the first direction may be 0.02 mm to 0.04 mm. Exemplarily, the length L3 of the virtual pixel region 30 in the first direction may be 0.03 mm.

In an exemplary embodiment, a distance L6 between a side of the gate driving circuit 20 close to the display region and the virtual pixel area may be 0.01 mm to 0.03 mm. Exemplarily, the distance L6 between the side of the gate driving circuit 20 close to the display region and the virtual pixel area may be 0.02 mm.

The accompanying drawings of the present disclosure only involve the structures involved in the embodiments of the present disclosure, and the other structures may refer to conventional designs.

For the sake of clarity, in the accompanying drawings used to describe the embodiments of the present disclosure, the thickness and dimension of a layer or a micro structure is enlarged. It is to be understood that when an element such as a layer, film, region or panel is described as being "on" or "under" another element, it can be "directly" located "on" or "under" the other element, or there may be an intermediate element.

Although the embodiments disclosed in the present disclosure are as above, the described contents are only embodiments used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A shift register, comprising a pull-up control sub-circuit, a pull-down control sub-circuit, an output sub-circuit and a noise reduction sub-circuit;
wherein the pull-up control sub-circuit is electrically connected with a first input terminal, a second output terminal, a first signal terminal, a second signal terminal and a pull-up control node, respectively, and is configured to provide a signal of the first signal terminal or the second signal terminal to the pull-up control node under control of the first input terminal and the second output terminal;
the pull-down control sub-circuit is electrically connected with a first clock signal terminal, a second clock signal terminal, the first signal terminal, the second signal terminal, the pull-up control node, a pull-down node, a first power supply terminal and a second power supply terminal, respectively, and is configured to provide a signal of the first power supply terminal or the second power supply terminal to the pull-down node under control of the pull-up control node, the first signal terminal, the second signal terminal, the first clock signal terminal and the second clock signal terminal;
the output sub-circuit is electrically connected with the pull-up control node, the first power supply terminal, a third clock signal terminal, a first output terminal, a fourth clock signal terminal and the second output terminal, respectively, and is configured to provide a signal of the third clock signal terminal to the first output terminal and provide a signal of the fourth clock signal terminal to the second output terminal under control of the pull-up control node and the first power supply terminal; and
the noise reduction sub-circuit is electrically connected with the pull-up control node, the first output terminal, the second output terminal, the pull-down node and the second power supply terminal, respectively, and is configured to provide a signal of the second power supply terminal to the pull-up control node, the first output terminal and the second output terminal under control of the pull-down node.

2. The shift register according to claim 1, wherein the output sub-circuit comprises a first output sub-circuit and a second output sub-circuit;
the first output sub-circuit is electrically connected with the pull-up control node, the first power supply terminal, the third clock signal terminal and the first output terminal, respectively, and is configured to provide the signal of the third clock signal terminal to the first output terminal under control of the first power supply terminal and the pull-up control node; and
the second output sub-circuit is electrically connected with the pull-up control node, the first power supply terminal, the fourth clock signal terminal and the second output terminal, respectively, and is configured to provide the signal of the fourth clock signal terminal to the second output terminal under control of the first power supply terminal and the pull-up control node.

3. The shift register according to claim 1, further comprising a reset sub-circuit;
wherein the reset sub-circuit is electrically connected with a reset signal terminal, the pull-up control node and the second power supply terminal, respectively, and is configured to provide a signal of the second power supply terminal to the pull-up control node under control of the reset signal terminal.

4. The shift register according to claim 1, wherein the pull-up control sub-circuit comprises a first transistor and a second transistor;
a control electrode of the first transistor is electrically connected with the first input terminal, a first electrode of the first transistor is electrically connected with the first signal terminal, and a second electrode of the first transistor is electrically connected with the pull-up control node; and
a control electrode of the second transistor is electrically connected with the second input terminal, a first electrode of the second transistor is electrically connected with the second signal terminal, and a second electrode of the second transistor is electrically connected with the pull-up control node.

5. The shift register according to claim 1, wherein the pull-down control sub-circuit comprises a third transistor, a fourth transistor, a fifth transistor, a sixth transistor and a first capacitor;
a control electrode of the third transistor is electrically connected with the first signal terminal, a first electrode of the third transistor is electrically connected with the first clock signal terminal, and a second electrode of the third transistor is electrically connected with a pull-down control node;
a control electrode of the fourth transistor is electrically connected with the second signal terminal, a first electrode of the fourth transistor is electrically connected with the second clock signal terminal, and a second electrode of the fourth transistor is electrically connected with the pull-down control node;

a control electrode of the fifth transistor is electrically connected with the pull-down control node, a first electrode of the fifth transistor is electrically connected with the first power supply terminal, and a second electrode of the fifth transistor is electrically connected with the pull-down node;

a control electrode of the sixth transistor is electrically connected with the pull-up control node, a first electrode of the sixth transistor is electrically connected with the pull-down node, and a second electrode of the sixth transistor is electrically connected with the second power supply terminal; and a first electrode of the first capacitor is electrically connected with the pull-down node, and a second electrode of the first capacitor is electrically connected with the second power supply terminal.

6. The shift register according to claim 2, wherein the first output sub-circuit comprises a seventh transistor, an eighth transistor and a second capacitor;

a control electrode of the seventh transistor is electrically connected with the first power supply terminal, a first electrode of the seventh transistor is electrically connected with the pull-up control node, and a second electrode of the seventh transistor is electrically connected with a first pull-up node;

a control electrode of the eighth transistor is electrically connected with the first pull-up node, a first electrode of the eighth transistor is electrically connected with the third clock signal terminal, and a second electrode of the eighth transistor is electrically connected with the first output terminal; and a first electrode of the second capacitor is electrically connected with the first pull-up node, and a second electrode of the second capacitor is electrically connected with the first output terminal.

7. The shift register according to claim 2, wherein the second output sub-circuit comprises a ninth transistor, a tenth transistor and a third capacitor;

a control electrode of the ninth transistor is electrically connected with the first power supply terminal, a first electrode of the ninth transistor is electrically connected with the pull-up control node, and a second electrode of the ninth transistor is electrically connected with a second pull-up node;

a control electrode of the tenth transistor is electrically connected with the second pull-up node, a first electrode of the tenth transistor is electrically connected with the fourth clock signal terminal, and a second electrode of the tenth transistor is electrically connected with the second output terminal; and a first electrode of the third capacitor is electrically connected with the second pull-up node, and a second electrode of the third capacitor is electrically connected with the second output terminal.

8. The shift register according to claim 1, wherein the noise reduction sub-circuit comprises an eleventh transistor, a twelfth transistor, and a thirteenth transistor;

a control electrode of the eleventh transistor is electrically connected with the pull-down node, a first electrode of the eleventh transistor is electrically connected with the pull-up control node, and a second electrode of the eleventh transistor is electrically connected with the second power supply terminal;

a control electrode of the twelfth transistor is electrically connected with the pull-down node, a first electrode of the twelfth transistor is electrically connected with the first output terminal, and a second electrode of the twelfth transistor is electrically connected with the second power supply terminal; and a control electrode of the thirteenth transistor is electrically connected with the pull-down node, a first electrode of the thirteenth transistor is electrically connected with the second output terminal, and a second electrode of the thirteenth transistor is electrically connected with the second power supply terminal.

9. The shift register according to claim 3, wherein the reset sub-circuit comprises a fourteenth transistor; and a control electrode of the fourteenth transistor is electrically connected with the reset signal terminal, a first electrode of the fourteenth transistor is electrically connected with the pull-up control node, and a second electrode of the fourteenth transistor is electrically connected with the second power supply terminal.

10. The shift register according to claim 1, further comprising a reset sub-circuit, wherein the pull-up control sub-circuit comprises a first transistor and a second transistor; the pull-down control sub-circuit comprises a third transistor, a fourth transistor, a fifth transistor, a sixth transistor and a first capacitor; the output sub-circuit comprises a seventh transistor, an eighth transistor, a second capacitor, a ninth transistor, a tenth transistor and a third capacitor;

the noise reduction sub-circuit comprises an eleventh transistor, a twelfth transistor and a thirteenth transistor; and the reset sub-circuit comprises a fourteenth transistor;

a control electrode of the first transistor is electrically connected with the first input terminal, a first electrode of the first transistor is electrically connected with the first signal terminal, and a second electrode of the first transistor is electrically connected with the pull-up control node;

a control electrode of the second transistor is electrically connected with the second input terminal, a first electrode of the second transistor is electrically connected with the second signal terminal, and a second electrode of the second transistor is electrically connected with the pull-up control node;

a control electrode of the third transistor is electrically connected with the first signal terminal, a first electrode of the third transistor is electrically connected with the first clock signal terminal, and a second electrode of the third transistor is electrically connected with a pull-down control node;

a control electrode of the fourth transistor is electrically connected with the second signal terminal, a first electrode of the fourth transistor is electrically connected with the second clock signal terminal, and a second electrode of the fourth transistor is electrically connected with the pull-down control node;

a control electrode of the fifth transistor is electrically connected with the pull-down control node, a first electrode of the fifth transistor is electrically connected with the first power supply terminal, and a second electrode of the fifth transistor is electrically connected with the pull-down node;

a control electrode of the sixth transistor is electrically connected with the pull-up control node, a first electrode of the sixth transistor is electrically connected with the pull-down node, and a second electrode of the sixth transistor is electrically connected with the second power supply terminal;

a first electrode of the first capacitor is electrically connected with the pull-down node, and a second electrode of the first capacitor is electrically connected with the second power supply terminal;

a control electrode of the seventh transistor is electrically connected with the first power supply terminal, a first electrode of the seventh transistor is electrically connected with the pull-up control node, and a second electrode of the seventh transistor is electrically connected with a first pull-up node;

a control electrode of the eighth transistor is electrically connected with the first pull-up node, a first electrode of the eighth transistor is electrically connected with the third clock signal terminal, and a second electrode of the eighth transistor is electrically connected with the first output terminal;

a first electrode of the second capacitor is electrically connected with the first pull-up node, and a second electrode of the second capacitor is electrically connected with the first output terminal;

a control electrode of the ninth transistor is electrically connected with the first power supply terminal, a first electrode of the ninth transistor is electrically connected with the pull-up control node, and a second electrode of the ninth transistor is electrically connected with a second pull-up node;

a control electrode of the tenth transistor is electrically connected with the second pull-up node, a first electrode of the tenth transistor is electrically connected with the fourth clock signal terminal, and a second electrode of the tenth transistor is electrically connected with the second output terminal;

a first electrode of the third capacitor is electrically connected with the second pull-up node, and a second electrode of the third capacitor is electrically connected with the second output terminal;

a control electrode of the eleventh transistor is electrically connected with the pull-down node, a first electrode of the eleventh transistor is electrically connected with the pull-up control node, and a second electrode of the eleventh transistor is electrically connected with the second power supply terminal;

a control electrode of the twelfth transistor is electrically connected with the pull-down node, a first electrode of the twelfth transistor is electrically connected with the first output terminal, and a second electrode of the twelfth transistor is electrically connected with the second power supply terminal;

a control electrode of the thirteenth transistor is electrically connected with the pull-down node, a first electrode of the thirteenth transistor is electrically connected with the second output terminal, and a second electrode of the thirteenth transistor is electrically connected with the second power supply terminal; and a control electrode of the fourteenth transistor is electrically connected with the reset signal terminal, a first electrode of the fourteenth transistor is electrically connected with the pull-up control node, and a second electrode of the fourteenth transistor is electrically connected with the second power supply terminal.

11. A gate driving circuit, comprising a plurality of cascaded shift registers according to claim 1;
wherein a first input terminal of an i+1 stage shift register is electrically connected with a first output terminal of an i stage shift register, and a second input terminal of the i+1 stage shift register is electrically connected with a second output terminal of an i+2 stage shift register.

12. The gate driving circuit according to claim 11, further comprising an initial signal line, a first clock line, a second clock line, a third clock line, a fourth clock line, a fifth clock line, a sixth clock line, a reset signal line, a first power supply line, a second power supply line, a first signal line and a second signal line; wherein reset signal terminals of all shift registers are connected with the reset signal line, first power supply terminals of all the shift registers are connected with the first power supply line, second power supply terminals of all the shift registers are connected with the second power supply line, first signal terminals of all the shift registers are connected with the first signal line, and second signal terminals of all the shift registers are connected with the second signal line; and a first input terminal of a first stage shift register is connected with the initial signal line, a first clock signal terminal of a 3i-2 stage shift register is connected with the sixth clock line, a second clock signal terminal of the 3i-2 stage shift register is connected with the first clock line, a third clock signal terminal of the 3i-2 stage shift register is connected with the third clock line, a fourth clock signal terminal of the 3i-2 stage shift register is connected with the fourth clock line, a first clock signal terminal of a 3i-1 stage shift register is connected with the second clock line, a second clock signal terminal of the 3i-1 stage shift register is connected with the third clock line, a third clock signal terminal of the 3i-1 stage shift register is connected with the fifth clock line, a fourth clock signal terminal of the 3i-1 stage shift register is connected with the sixth clock line, a first clock signal terminal of a 3i stage shift register is connected with the fourth clock line, a second clock signal terminal of the 3i stage shift register is connected with the fifth clock line, a third clock signal terminal of the 3i stage shift register is connected with the first clock line, and a fourth clock signal terminal of the 3i stage shift register is connected with the second clock line.

13. A display device, comprising the gate driving circuit according to claim 11 and a plurality of scan signal lines; wherein the scan signal lines extend in a first direction, and the plurality of scan signal lines are arranged in a second direction, the first direction and the second direction intersect; and a j stage shift register in the gate driving circuit is connected with a (2j-1)-th scan signal line and a 2j-th scan signal line, $1 \leq j \leq N$, N is the number of shift registers comprised in the gate driving circuit.

14. The device according to claim 13, wherein a lengh of the gate driving circuit in the first direction is about 0.35 mm to 0.37 mm.

15. A method for driving a shift register, configured to drive the shift register according to claim 1, comprising:
a pull-up control sub-circuit provides a signal of a first signal terminal or a second signal terminal to a pull-up control sub-circuit under control of a first input terminal and a second output terminal;

a pull-down control sub-circuit provides a signal of a first power supply terminal or a second power supply terminal to a pull-down node under control of a pull-up control node, the first signal terminal, the second signal terminal, a first clock signal terminal and a second clock signal terminal;

an output sub-circuit provides a signal of a third clock signal terminal to a first output terminal and provides a signal of a fourth clock signal terminal to a second output terminal under control of the pull-up control node and the first power supply terminal; and a noise reduction sub-circuit provides a signal of the second power supply terminal to the pull-up control node, the first output terminal and the second output terminal.

16. The method according to claim 15, further comprising: a reset sub-circuit provides a signal of the second power supply terminal to the pull-up control node under control of a reset signal terminal.

17. The shift register according to claim 2, further comprising a reset sub-circuit;
wherein the reset sub-circuit is electrically connected with a reset signal terminal, the pull-up control node and the second power supply terminal, respectively, and is configured to provide a signal of the second power supply terminal to the pull-up control node under control of the reset signal terminal.

* * * * *